(12) United States Patent
Jin et al.

(10) Patent No.: US 12,259,300 B2
(45) Date of Patent: Mar. 25, 2025

(54) SELF-DIAGNOSTIC GAS DENSITY RELAY AND USE METHOD THEREOF

(71) Applicant: SHANGHAI ROYE ELECTRIC CO., LTD., Shanghai (CN)

(72) Inventors: Haiyong Jin, Shanghai (CN); Tiexin Xia, Shanghai (CN); Zhengcao Guo, Shanghai (CN); Caixia Hao, Shanghai (CN); Haisheng Jin, Shanghai (CN)

(73) Assignee: SHANGHAI ROYE ELECTRIC CO., LTD., Shanghai (CN)

( * ) Notice: Subject to any disclaimer, the term of this patent is extended or adjusted under 35 U.S.C. 154(b) by 354 days.

(21) Appl. No.: 17/997,546

(22) PCT Filed: Feb. 9, 2021

(86) PCT No.: PCT/CN2021/076128
§ 371 (c)(1),
(2) Date: Oct. 29, 2022

(87) PCT Pub. No.: WO2021/218283
PCT Pub. Date: Nov. 4, 2021

(65) Prior Publication Data
US 2023/0168145 A1 Jun. 1, 2023

(30) Foreign Application Priority Data
Apr. 29, 2020 (CN) .......................... 202010355098.8

(51) Int. Cl.
*G01M 3/32* (2006.01)
*G01L 7/04* (2006.01)
(Continued)

(52) U.S. Cl.
CPC ............ *G01M 3/3272* (2013.01); *G01L 7/041* (2013.01); *G01L 7/045* (2013.01); *G01N 9/002* (2013.01);
(Continued)

(58) Field of Classification Search
CPC ...... G01M 3/3272; G01L 7/041; G01L 7/045; H01H 11/0062; H01H 35/32; H01H 35/36;
(Continued)

(56) References Cited

U.S. PATENT DOCUMENTS

| 6,263,914 B1 | 7/2001 | Meyer et al. |
| 2021/0043402 A1* | 2/2021 | Jin .......................... G01L 7/048 |
| 2023/0221370 A1* | 7/2023 | Jin ......................... H01H 35/28 |
| | | 324/418 |

FOREIGN PATENT DOCUMENTS

| CN | 109243914 A | * 1/2019 | ............ G01L 7/048 |
| CN | 110534377 A | * 12/2019 | ........... G01K 15/005 |

(Continued)

*Primary Examiner* — Jonathan M Dunlap
(74) *Attorney, Agent, or Firm* — Hsuanyeh Law Group, PC

(57) ABSTRACT

The present application provides a self-diagnostic gas density relay and a use method thereof, the gas density relay includes a gas density relay body, a gas density detection sensor, at least one diagnostic sensor, and an intelligent control unit; where the diagnostic sensor is configured to acquire deformation quantities of components that generate deformations, and/or positions or displacement quantities of components that generate displacements when the pressure changes, or the temperature changes, or the gas density changes in the gas density relay body; and the intelligent control unit is respectively connected with the gas density detection sensor and the diagnostic sensor, receives data acquired by the gas density detection sensor and/or the diagnostic sensor, and diagnoses a current working state of the gas density relay body. The present application is used for monitoring a gas density of the gas-insulated or arc-extinguished electrical equipment, and at the same time, on-line self-inspection for the gas density relay is completed, so that efficiency is increased, no maintenance is (Continued)

realized, operation and maintenance costs are greatly reduced, and safe operation of a power grid is guaranteed.

20 Claims, 4 Drawing Sheets

(51) Int. Cl.
    *G01N 9/00*     (2006.01)
    *G01R 31/327*     (2006.01)
    *H01H 11/00*     (2006.01)
    *H01H 33/56*     (2006.01)
    *H01H 35/26*     (2006.01)
    *H01H 35/32*     (2006.01)
    *H01H 35/36*     (2006.01)

(52) U.S. Cl.
    CPC ...... *G01N 2009/006* (2013.01); *G01R 31/327* (2013.01); *H01H 11/0062* (2013.01); *H01H 33/563* (2013.01); *H01H 35/26* (2013.01); *H01H 35/32* (2013.01); *H01H 35/36* (2013.01)

(58) Field of Classification Search
    CPC ...... H01H 35/26; H01H 33/563; G01N 9/002; G01N 9/00; G01N 2009/006; G01R 31/327
    See application file for complete search history.

(56) References Cited

FOREIGN PATENT DOCUMENTS

| | | |
|---|---|---|
| CN | 110849768 A | 2/2020 |
| CN | 110988667 A | 4/2020 |
| CN | 111446116 A | 7/2020 |
| CN | 211929384 U | 11/2020 |

* cited by examiner

SELF-DIAGNOSTIC GAS DENSITY RELAY AND USE METHOD THEREOF

RELATED APPLICATIONS

This is a US national stage application of international application no. PCT/CN2021/076128, filed Feb. 9, 2021, which claims the priority of Chinese Patent Application 202010355098.8 (TITLE: SELF-DIAGNOSTIC GAS DENSITY RELAY AND USE METHOD THEREOF) filed on Apr. 29, 2020.

TECHNICAL FIELD

The present invention relates to the technical field of electric power, and in particular to a self-diagnostic gas density relay applied to high-voltage and medium-voltage electrical equipment, and a use method thereof.

BACKGROUND

At present, SF6 (sulfur hexafluoride) electrical equipment has been widely applied in electric power departments and industrial and mining enterprises, promoting the rapid development of the electric power industry. In recent years, with the rapid economic development, the capacity of China's electric power system has expanded rapidly, and the amount of SF6 electrical equipment is increasing. The SF6 gas plays the role of arc extinguishing and insulation in the high-voltage electrical equipment. If the SF6 gas density in the high-voltage electrical equipment decreases, and a micro-moisture content exceeds the standard, the safe operation of the SF6 high-voltage electrical equipment may be seriously affected: 1) the decrease of the SF6 gas density to a certain extent may lead to the loss of insulation and arc extinguishing performance; 2) with the participation of some metal objects, the SF6 gas may hydrolyze with water at a high temperature above 200° C. to generate active HF and $SOF_2$, insulating parts and metal parts are corroded, and a large amount of heat is generated, so that a pressure of a gas chamber is increased; and 3) when the temperature decreases, too much water may form condensation water, which significantly reduces the surface insulating strength of the insulating parts, even flashover, causing serious harm. Therefore, it is mandatory in the operation regulations of power grid that the density and water content of the SF6 gas must be regularly detected before the equipment is put into operation and in operation.

With the development of unattended substations in a direction of networking and digitalization, and increasing requirements for remote control and telemetering, on-line monitoring for a gas density and a micro-moisture content state of the SF6 electrical equipment has important practical significance. With the continuous development of the intelligent power grid in China, intelligent high-voltage electrical equipment, as an important component and a key node of an intelligent substation, plays a pivotal role in the safety of the intelligent power grid. At present, most of the high-voltage electrical equipment is the SF6 gas insulating equipment. If the gas density decreases (such as leakage, etc.), the electrical performance of the equipment may be seriously affected and cause serious hidden dangers to the safe operation. At present, it is very common to monitor a gas density value in SF6 high-voltage electrical equipment on line, and existing gas density monitoring systems (gas density relays) are basically as follows: 1) a remote-transmission SF6 gas density relay is applied to realize acquisition and uploading for a density, a pressure, and a temperature, so that on-line monitoring for the gas density is realized; and 2) use a gas density transmitter to acquire and upload the density, pressure and temperature to realize the online monitoring of the gas density. The SF6 gas density relay is a core and a key component, the remote-transmission SF6 gas density relay or the gas density transmitter is a core and a key component, and how to ensure normal working of the SF6 gas density relay and the remote-transmission SF6 gas density relay or the gas density transmitter is very critical.

Regular inspection for the gas density relay on the electrical equipment is a necessary measure to prevent problems before the problems occur and to ensure safe and reliable operation of the electrical equipment. Both Electric Power Preventive Test Regulations and Twenty-five Key Requirements for Preventing Major Accidents in Electric Power Production require that the gas density relay should be verified regularly. From an actual operation point of view, a regular check of the gas density relay is one of a necessary means to ensure the safe and reliable operation of electric power equipment. In addition, if an on-line monitoring apparatus for the gas density or the remote-transmission density relay is verified or inspected, a lot of manpower and material resources are required.

Therefore, it is very necessary to develop a self-diagnostic gas density relay or a gas density monitoring apparatus, which is applied in a gas density monitoring system based on the ubiquitous electric power Internet of Things, and on-line self-inspection and check on the gas density relay can be realized, so that no maintenance is realized, efficiency is increased, and safety is ensured.

SUMMARY

The present invention provides a self-diagnostic gas density relay (or a gas density monitoring apparatus) for high-voltage or medium-voltage electrical equipment, and a use method thereof, the gas density relay is used for monitoring a gas density of the gas-insulated or arc-extinguished electrical equipment, and at the same time, on-line self-inspection and check on the gas density relay is completed, so that efficiency is increased, no maintenance is realized, operation and maintenance costs are reduced, and safe operation of a power grid is guaranteed.

To achieve the above purpose, the invention uses the following technical solutions:

a first aspect of the present application provides a self-diagnostic gas density relay (or a gas density monitoring apparatus), and the gas density relay includes: a gas density relay body, a gas density detection sensor, at least one diagnostic sensor, and an intelligent control unit;

the gas density relay body includes: a housing, and a pressure detection element, a temperature compensation element, a signal generator, and a signal action mechanism which are arranged in the housing;

the gas density detection sensor is communicated with the gas density relay body, and used for acquiring a pressure value, a temperature value, and/or a gas density value;

the diagnostic sensor is arranged in the housing of the gas density relay body, and configured to acquire deformation quantities of components that generate deformations, and/or positions or displacement quantities of components that generate displacements when the pressure changes, or the temperature changes, or the gas density changes in the gas density relay body; and the intelligent control unit is respectively connected with the gas density detection sensor and the diagnostic sensor, and configured to receive data acquired by the gas density detection sensor and/or the diagnostic sensor, and diagnose whether a current working state of the gas density relay body is normal or not by judging whether the deformation quantities, and/or the positions, and/or the displacement quantities are within preset thresholds or not, or by comparing the deformation quantities, and/or the positions, and/or the displacement quantities with preset standard values corresponding thereto; or, the intelligent control unit is configured to upload the received data to a background, and the background diagnoses whether the current working state of the gas density relay body is normal or not by judging whether the deformation quantities, and/or the positions, and/or the displacement quantities are within the preset thresholds or not, or by comparing the deformation quantities, and/or the positions, and/or the displacement quantities with preset standard values corresponding thereto.

Preferably, the diagnostic sensor is arranged on the pressure detection element; or, the diagnostic sensor is arranged on the temperature compensation element; or, the diagnostic sensor is arranged on the signal action mechanism; or, there are two diagnostic sensors, one of which is arranged on the pressure detection element and the other is arranged on the temperature compensation element.

Preferably, the diagnostic sensor includes one or more of a displacement sensor, a magnetic sensor, a gravity sensor, a pressure sensor, a deformation quantity sensor, a distance measurement sensor, a photoelectric sensor, an angle sensor, an ultrasonic sensor, an infrared sensor, a deformation sheet sensor and a camera.

Preferably, the gas density relay body and the gas density detection sensor are of an integrated structure. The gas density relay body and the gas density detection sensor are preferably a remote-transmission gas density relay with an integrated structure.

Preferably, the gas density detection sensor is of an integrated structure. The gas density detection sensor is preferably a gas density transmitter with an integrated structure.

Preferably, the gas density detection sensor includes at least one pressure sensor and at least one temperature sensor; or, the gas density detection sensor is a gas density transmitter composed of a pressure sensor and a temperature sensor; or, the gas density detection sensor is a density detection sensor adopting a quartz tuning fork technology.

More preferably, the pressure sensor is installed in a gas path of the gas density relay body; and the temperature sensor is installed in a gas path or outside the gas path of the gas density relay body, or is installed in the gas density relay body or outside the gas density relay body.

More preferably, the pressure sensor includes a relative pressure sensor and/or an absolute pressure sensor.

Preferably, the intelligent control unit obtains a gas density value acquired by the gas density detection sensor; or, the intelligent control unit obtains a pressure value and a temperature value which is acquired by the gas density detection sensor, so that on-line monitoring for the gas density of the monitored electrical equipment by the gas density relay is completed.

Preferably, the signal generator includes a microswitch or a magnetic-assisted electrical contact, and the gas density relay body outputs contact signals (alarm, and/or blocking) through the signal generator; the pressure detector includes a Bourdon tube or a bellow; and the temperature compensation element adopts a temperature compensation sheet or a gas enclosed in the housing.

Preferably, the diagnostic sensor detects a deformation quantity of the temperature compensation element relative to an overall dimension at 20° C., the intelligent control unit or the background judges whether the deformation quantity is within a preset threshold or not, if the deformation quantity is within the preset threshold, a current working state of the temperature compensation element is normal, otherwise the current working state is abnormal; or, a corresponding relationship between a temperature change value $\Delta T$ of each historical detected environment temperature T relative to 20° C., and a corresponding preset standard value of a deformation quantity $\Delta L$ of the temperature compensation element is pre-generated into a data table; the intelligent control unit or the background calculates a difference, that is, an error, between the deformation quantity detected by the diagnostic sensor, of the temperature compensation element, and the corresponding preset standard value obtained by querying the data table, under current temperature change, and judges whether the error is within a preset threshold or not, if the error is within the preset threshold, the current working state of the temperature compensation element is normal, otherwise, the current working state is abnormal; where $\Delta T=|T-20|°$ C., $\Delta L=|L_T-L_{20}|$, $L_T$ is a corresponding overall dimension of the temperature compensation element at an environment temperature T, and $L_{20}$ is a corresponding overall dimension of the temperature compensation element at 20° C.

Preferably, the diagnostic sensor detects a position of the temperature compensation element under a set gas density value, and the intelligent control unit or the background judges whether the position is within a preset threshold or not, if the position is within the preset threshold, the current working state of the temperature compensation element is normal, otherwise, the current working state is abnormal; or, a corresponding relationship between each historical detected gas density value and a corresponding preset standard value of the position of the temperature compensation element is pre-generated into a data table; the intelligent control unit or the background calculates a difference, that is, an error, between the position detected by the diagnostic sensor, of the temperature compensation element, and the corresponding preset standard value obtained by querying the data table, under a current gas density, judges whether the error is within a preset threshold or not, if the error is within the preset threshold, the current working state of the temperature compensation element is normal, otherwise the current working state is abnormal; or, the diagnostic sensor detects a displacement quantity of the temperature compensation element when the gas density changes, and the intelligent control unit or the background judges whether the displacement quantity is within a preset threshold or not, if the displacement quantity is within the preset threshold, the current working state of the temperature compensation element is normal, otherwise, the current working state is abnormal; or, a corresponding relationship between each historical detected gas density change value and a corresponding preset standard value of the displacement quantity of the temperature compensation element is pre-generated into a data table; the intelligent control unit or the background calculates a difference, that is, an error, between the displacement quantity detected by the diagnostic sensor, of the temperature compensation element, and the corresponding preset standard value obtained by querying the data table, under current gas density change, judges whether the error is within a preset threshold or not, if the error is within the preset threshold, the current working state of the temperature compensation element is normal, otherwise the current working state is abnormal.

Preferably, the diagnostic sensor detects a position of the pressure detection element under a set gas pressure value, the intelligent control unit or the background judges whether the position is within a preset threshold or not, if the position is within the preset threshold, a current working state of the pressure detection element is normal, otherwise, the current working state is abnormal; or, a corresponding relationship between each historical detected gas pressure value and a corresponding preset standard value of the position of the pressure detection element is pre-generated into a data table; the intelligent control unit or the background calculates a difference, that is, an error, between the position detected by the diagnostic sensor, of the pressure detection element, and the corresponding preset standard value obtained by querying the data table, under a current gas pressure, judges whether the error is within a preset threshold or not, if the error is within the preset threshold, the current working state of the pressure detection element is normal, otherwise the current working state is abnormal; or, the diagnostic sensor detects a displacement quantity of the pressure detection element when the gas pressure changes, the intelligent control unit or the background judges whether the displacement quantity is within a preset threshold or not, if the displacement quantity is within the preset threshold, the current working state of the pressure detection element is normal, otherwise, the current working state is abnormal; or, a corresponding relationship between each historical detected gas pressure change value and a corresponding preset standard value of the displacement quantity of the pressure detection element is pre-generated into a data table; the intelligent control unit or the background calculates a difference, that is, an error, between the displacement quantity detected by the diagnostic sensor, of the pressure detection element, and the corresponding preset standard value obtained by querying the data table, under current gas pressure change, and judges whether the error is within a preset threshold or not, if the error is within the preset threshold, the current working state of the pressure detection element is normal, otherwise, the current working state is abnormal.

Preferably, the diagnostic sensor detects a position of the signal action mechanism under a set gas density value, the intelligent control unit or the background judges whether the position is within a preset threshold or not, if the position is within the preset threshold, a current working state of the signal action mechanism is normal, otherwise, the current working state is abnormal; or, a corresponding relationship between each historical detected gas density value and a corresponding preset standard value of the position of the signal action mechanism is pre-generated into a data table; the intelligent control unit or the background calculates a difference, that is, an error, between the position detected by the diagnostic sensor, of the signal action mechanism, and the corresponding preset standard value obtained by querying the data table, under a current gas density, judges whether the error is within a preset threshold or not, if the error is within the preset threshold, the current working state of the signal action mechanism is normal, otherwise the current working state is abnormal; or, the diagnostic sensor detects a displacement quantity of the signal action mechanism when the gas density value changes, the intelligent control unit or the background judges whether the displacement quantity is within a preset threshold or not, if the displacement quantity is within the preset threshold, the current working state of the signal action mechanism is normal, otherwise, the current working state is abnormal; or, a corresponding relationship between each historical detected gas density change value and a corresponding preset standard value of the displacement quantity of the signal action mechanism is pre-generated into a data table; the intelligent control unit or the background calculates a difference, that is, an error, between the displacement quantity detected by the diagnostic sensor, of the signal action mechanism, and the corresponding preset standard value obtained by querying the data table, under current gas density change, and judges whether the error is within a preset threshold or not, if the error is within the preset threshold, the current working state of the signal action mechanism is normal, otherwise, the current working state is abnormal.

Preferably, the gas density relay (or gas density monitoring apparatus) further includes: a drive contact action mechanism, where the drive contact action mechanism is arranged inside or outside the housing of the gas density relay body, and connected with the intelligent control unit; the drive contact action mechanism includes a force application mechanism and a movement mechanism, the force application mechanism includes a drive component and a force transmission part driven by the drive component, the movement mechanism includes a push rod, and the push rod moves under the driving of the force application mechanism, to apply an action force to the gas density relay body and directly or indirectly enable the signal action mechanism to generate a displacement, so as to trigger the signal generator to generate a contact signal action; where the contact signal includes alarm and/or blocking.

More preferably, the drive component includes one or more of a magnetic drive mechanism, gravity, a motor, a reciprocating movement mechanism, a Carnot cycle mechanism, an air compressor, a compressor, a gas release valve, a pressure making pump, a booster pump, a booster valve, an electric air pump, an electromagnetic air pump, a pneumatic element, a magnetic coupling thrust mechanism, a heating thrust-generation mechanism, a mechanism generating thrust with electrical heating, and a mechanism generating thrust with chemical reaction.

More preferably, the force transmission part includes one of a cam, a connecting rod, a spring, a metal part, a non-metal part, an expansion part and a non-expansion part.

More preferably, the gas density relay body further includes a base, an end base and a core which are arranged in the housing; the core is fixed on the base; the pressure detection element is a Bourdon tube, one end of the pressure detection element is fixed on the base and communicated with the base, the other end of the pressure detection element is connected with one end of the temperature compensation element through the end base, and the other end of the temperature compensation element is provided with a signal action mechanism; an adjusting screw or a triggering part for pushing the signal generator and connecting or disconnecting a contact of the signal generator is arranged on the signal action mechanism, and the gas density relay body outputs a contact signal through the signal generator; and the drive contact action mechanism is arranged outside the housing of the gas density relay body, and the drive contact action mechanism further includes an outer cover with an opening, where the outer cover is fixedly connected to the housing, the opening faces the housing, and the drive component, the force transmission part, and the push rod are arranged in the outer cover.

Further, one end, facing the force application mechanism, of the push rod, passes through a fixed frame, the fixed frame is fixedly arranged on the housing of the gas density relay body, and one end, away from the force application mechanism, of the push rod, stretches out from the opening of the outer cover, and then stretches into the housing through a gas hole in the housing of the gas density relay body; and an end part, stretching into the housing, of the push rod, is arranged opposite to the pressure detection element in the housing.

Further, a reset spring is arranged on the push rod between the fixed frame and the gas hole in a sleeved manner.

Specifically, the force transmission part is a cam, an end surface, opposite to a convex part of the cam, on the cam, contacts the end, facing the force transmission part, of the push rod, and the reset spring is in a naturally-stretching state; and the drive component drives the cam to rotate, the convex part of the cam strikes the push rod, and drives the push rod to move in the axial direction of the push rod, and when the convex part of the cam leaves the end, facing the force transmission part, of the push rod, the push rod is reset under the action of an elastic force of the reset spring.

Further, the core includes a sector gear and a center gear, a first end part of the sector gear is meshed with the center gear, and a second end part of the sector gear is connected with the other end of the temperature compensation element through a connection rod or directly; and the second end part of the sector gear is fixedly connected with one end of a contact part of the sector gear, and the other end of the contact part of the sector gear stretches out of the housing from the gas hole of the housing of the gas density relay body, and is arranged opposite to the end, away from the force application mechanism, of the push rod of the driving contact action mechanism.

Further, the force application mechanism applies an action force to the contact part of the sector gear through the push rod, the second end part of the sector gear generates a displacement, and the second end part of the sector gear drives the temperature compensation element to generate a displacement through the connection rod; and the first end part, meshed with the center gear, of the sector gear, drives the center gear to rotate, the center gear and a pointer are installed on a drive rod, and rotation of the center gear drives the drive rod to rotate, so that the pointer moves and indicates on a dial.

More preferably, the gas density relay body includes a first bellow arranged in the housing as the pressure detection element, and further includes a second bellow, where a first open end of the first bellow is fixed to an inner wall of the housing, a second open end of the first bellow is connected with a first sealing part in a sealed manner, an inner wall of the first bellow, the first sealing part, and the inner wall of the housing form a first sealing gas chamber in an encircling manner, and the first sealing gas chamber is provided with a connector communicated with insulating gas of the electrical equipment; a first open end of the second bellow is connected with the first sealing part in a sealed manner, a second open end of the second bellow is connected with the inner wall of the housing through a second sealing part, an outer wall of the first bellow, the first sealing part, an outer wall of the second bellow, the second sealing part, and the inner wall of the housing form a second sealing gas chamber in an encircling manner, and the second sealing gas chamber is filled with a standard compensation gas to form the temperature compensation element; an inner wall of the second bellow, the second sealing part, and the inner wall of the housing form a third gas chamber in an encircling manner, the signal generator and the signal action mechanism are arranged in the third gas chamber, the signal action mechanism is connected with the first sealing part, and the signal generator is arranged corresponding to the signal action mechanism; and the driving contact action mechanism is arranged in the housing of the gas density relay body, one end, close to the force transmission part, of the push rod, is provided with a fixing part, and one end, away from the force transmission part, of the push rod, penetrates through the fixed frame fixed to the inner wall of the housing, and extends to a place below the fixed frame to be arranged opposite to the signal action mechanism.

Further, an outer diameter of the first bellow is greater than an outer diameter of the second bellow.

Further, the signal action mechanism includes a moving rod, one end of the moving rod stretches into the second bellow, is connected with the first sealing part, and generates a displacement with the deformation of the first bellow; and the other end of the moving rod stretches out of the second bellow, and is fixedly connected with an adjusting and fixing part, and an adjusting screw is arranged on the adjusting and fixing part, and used for touching the signal generator under a pushing force of the moving rod.

Further, a reset spring is arranged on the push rod between the fixing part and the fixed frame in a sleeved manner.

More preferably, the intelligent control unit obtains a pressure value P1 and a temperature value T which are acquired by the gas density detection sensor, and a displacement quantity D acquired by the diagnostic sensor, in the case of contact signal action or switching of the gas density relay body, a corresponding pressure value P2 is obtained by calculating or converting according to the displacement quantity D, an equivalent gas pressure value P is obtained by calculating according to the pressure value P1 and the pressure value P2; and a pressure value corresponding to 20° C., i.e., a gas density value P20, is obtained by converting according to the equivalent gas pressure value P and a gas pressure-temperature characteristic, so that on-line check on the gas density relay is completed; or, The intelligent control unit obtains a gas density value P120 acquired by the gas density detection sensor, and a displacement quantity D acquired by the diagnostic sensor, in the case of contact signal action or switching of the gas density relay body, a corresponding gas density value P220 is obtained by calculating or converting in combination with a temperature value T acquired by the temperature sensor, and the gas density value P20 is obtained by calculating according to the gas density value P120 and the gas density value P220, so that on-line check on the gas density relay is completed.

Further, in the case of contact signal action or switching of the gas density relay body, the equivalent gas pressure value P=P1−P2; a pressure value corresponding to 20° C., i.e., a gas density value P20, is obtained by converting according to the equivalent gas pressure value P and the gas pressure-temperature characteristic, so that on-line check on the gas density relay is completed; or, in the case of contact signal action or switching of the gas density relay body, the equivalent gas pressure value P=P1−P2*K, where K is a preset coefficient; and a pressure value corresponding to 20° C., i.e., a gas density value P20, is obtained by converting according to the equivalent gas pressure value P and the gas pressure-temperature characteristic, so that online check on the gas density relay is completed.

Further, in the case of contact signal action or switching of the gas density relay body, a corresponding relationship among the gas density value P20, the gas density value P120, and the gas density value P220 is preset into a data table, and the corresponding gas density value P20 is obtained by querying the data table according to the gas density value P120 and the gas density value P220, so that on-line check on the gas density relay is completed; or, in the case of contact signal action or switching of the gas density relay body, a corresponding relationship among the gas density value P20, the gas pressure value P1, the gas pressure value P2, and the temperature value T is preset into a data table, and the corresponding gas density value P20 is obtained by querying the data table according to the gas pressure value P1, the gas pressure value P2 and the temperature value T, so that on-line check on the gas density relay is completed.

More preferably, the gas density relay (or the gas density monitoring apparatus) further includes a force measurement sensor, where the force measurement sensor is arranged on the driving contact action mechanism or arranged in the housing, connected with the intelligent control unit, and configured to detect a force applied by the driving contact action mechanism on the gas density relay body.

Further, the force measurement sensor includes one of a gravity sensor, a pressure sensor, a magnetic sensor, a displacement sensor, a deformation quantity sensor, a photoelectric sensor, an angle sensor, and a camera.

Further, the force measurement sensor is arranged on the push rod of the driving contact action mechanism; or, the force measurement sensor is arranged on the pressure detection element; or, the force measurement sensor is arranged on the temperature compensation element; or, the force measurement sensor is arranged on the signal action mechanism.

Further, the intelligent control unit obtains a pressure value P1 and a temperature value T which are acquired by the gas density detection sensor, and a signal value F acquired by the force measurement sensor, in the case of contact signal action or switching of the gas density relay body, a corresponding equivalent pressure value P3 is obtained by calculating or converting according to the pressure value P1, the temperature value T and the signal value F, and an equivalent gas pressure value P is obtained by calculating according to the pressure value P1 and the pressure value P3; a pressure value corresponding to 20° C., i.e., a gas density value P20, is obtained by converting according to the equivalent gas pressure value P and the gas pressure-temperature characteristic, so that on-line check on the gas density relay is completed; or, The intelligent control unit obtains a gas density value P120 acquired by the gas density detection sensor, a signal value F acquired by the force measurement sensor, and a temperature value acquired by the temperature sensor, in the case of contact signal action or switching of the gas density relay body, a corresponding equivalent gas density value P320 is obtained by calculating and converting according to the gas density value P120, the signal value F, and the temperature value, and the gas density value P20 is obtained by calculating according to the gas density value P120 and the gas density value P320, so that on-line check on the gas density relay is completed.

Further, in the case of contact signal action or switching of the gas density relay body, the equivalent gas pressure value P=P1−P3; a pressure value corresponding to 20° C., i.e., a gas density value P20, is obtained by converting according to the equivalent gas pressure value P and the gas pressure-temperature characteristic, so that on-line check on the gas density relay is completed; or, in the case of contact signal action or switching of the gas density relay body, the equivalent gas pressure value P=P1−P3*M, where M is a preset coefficient; and a pressure value corresponding to 20° C., i.e. a gas density value P20, is obtained by converting according to the equivalent gas pressure value P, the temperature value T, and the gas pressure-temperature characteristic, so that on-line check on the gas density relay is completed.

Further, in the case of contact signal action or switching of the gas density relay body, a corresponding relationship among the gas density value P20, the gas density value P120, and the gas density value P320 is pre-designed into a data table, and the corresponding gas density value P20 is obtained by querying the data table according to the gas density value P120 and the gas density value P320, so that on-line check on the gas density relay is completed; or, in the case of contact signal action or switching of the gas density relay body, a corresponding relationship among the gas density value P20, the gas pressure value P1, the gas pressure value P3 and the temperature value T is pre-designed into a data table, and the corresponding gas density value P20 is obtained by querying the data table according to the gas pressure value P1, the gas pressure value P3, and the temperature value T, so that on-line check on the gas density relay is completed; or, in the case of contact signal action or switching of the gas density relay body, a corresponding relationship among the gas density value P20, the gas pressure value P1, the signal value F acquired by the force measurement sensor, and the temperature value T is pre-designed into a data table, and the corresponding gas density value P20 is obtained by querying the data table according to the gas pressure value P1, the signal value F acquired by the force measurement sensor, and the temperature value T, so that on-line check on the gas density relay is completed; or, in the case of contact signal action or switching of the gas density relay body, a corresponding relationship among the gas density value P20, the gas pressure value P1, the displacement quantity D acquired by the diagnostic sensor, and the temperature value T is pre-designed into a data table, and the corresponding gas density value P20 is obtained by querying the data table according to the gas pressure value P1, the displacement D acquired by the diagnostic sensor, and the temperature value T, so that on-line check on the gas density relay is completed.

Preferably, the gas density relay (or gas density monitoring apparatus) further includes an on-line check contact signal sampling unit, and the on-line check contact signal sampling unit is respectively connected with the signal generator and the intelligent control unit of the gas density relay body, and configured to sample the contact signal of the gas density relay body.

More preferably, the on-line check contact signal sampling unit includes an isolation sampling element, and the isolation sampling element is controlled by the gas density relay body or the intelligent control unit; in a non-check state, the on-line check contact signal sampling unit is relatively isolated from the contact signal of the gas density relay body in a circuit through the isolation sampling element; in a check state, the on-line check contact signal sampling unit cuts off a control loop for the contact signal of the gas density relay body through the isolation sampling element, and connects the contact of the gas density relay body with the intelligent control unit; where the isolation sampling element includes one of a travel switch, a microswitch, a button, an electric switch, a displacement switch, an electromagnetic relay, an optical coupler and a silicon controlled rectifier.

More preferably, sampling for the contact signal of the gas density relay body by the on-line check contact signal sampling unit meets: the on-line check contact signal sampling unit is provided with at least two independent groups of sampling contacts, at least two contacts may be automatically verified at the same time, and continuous measurement is realized without changing the contacts or reselecting the contacts; where the contacts include, but are not limited to, one of an alarm contact, an alarm contact+a blocking contact, an alarm contact+a blocking contact 1+a blocking contact 2, an alarm contact+a blocking contact+an overvoltage contact.

More preferably, a test voltage for an action value or a switching value of the contact signal of the gas density relay body, of the on-line check contact signal sampling unit, is not less than 24V, that is, during check, a voltage of not less than 24V is applied between corresponding terminals of the contact signal.

More preferably, the gas density relay (or gas density monitoring apparatus) further includes: a multi-way connector, and one or more of the gas density relay body, the gas density detection sensor, the on-line check contact signal sampling unit, and the intelligent control unit are arranged on the multi-way connector.

Preferably, control of the intelligent control unit is realized in the field, and/or realized through the background.

Preferably, a display mechanism for displaying a density of the insulating gas is further arranged on the housing of the gas density relay body.

More preferably, the display mechanism includes a connection rod, a core, a pointer and a dial, the core is connected with the signal action mechanism or the temperature compensation element through the connection rod, the pointer is installed on the core and arranged in front of the dial, and the pointer displays a gas density value in combination with the dial; or, the display mechanism includes a liquid crystal tube or/and a digital tube.

Further, the diagnostic sensor is arranged on the core, or on the pointer, or on the connection rod.

Preferably, the gas density relay body includes, but is not limited to, a gas density relay compensated by a bimetallic sheet, a gas density relay compensated by gas, and a gas density relay with mixed compensation of a bimetallic sheet and gas; a fully-mechanical gas density relay, a digital gas density relay, and a mechanical-digital-combined gas density relay; a gas density relay with pointer display, a digital-display gas density relay, and a gas density switch without display or indication; and a SF6 gas density relay, a SF6 mixed gas density relay, and a N2 gas density relay.

Preferably, the gas density relay body is provided with a comparative density value output signal, and the comparative density value output signal is connected with the intelligent control unit; or, the gas density relay body is provided with a comparative pressure value output signal, and the comparative pressure value output signal is connected with the intelligent control unit.

Preferably, the intelligent control unit automatically controls the whole check process, including all peripherals, logic, input and output, based on an embedded system built-in algorithm and control program of the microprocessor.

More preferably, the intelligent control unit automatically controls a whole check process which includes all peripherals, logic, input and output, based on built-in algorithms and control programs of a general-purpose computer, an industrial control computer, an ARM chip, an AI chip, a CPU, a MCU, a FPGA, a PLC, an industrial control main board, an embedded master control board, etc.

Preferably, the intelligent control unit is provided with an electrical interface, and the electrical interface completes test data storage, and/or test data export, and/or test data printing, and/or data communication with an upper computer, and/or analog quantity and digital quantity information inputting.

More preferably, the gas density relay (or gas density monitoring apparatus) supports basic information input, and the basic information includes one or more of a manufacturing number, an accuracy requirement, a rated parameter, a manufacturer, and an operating position.

Preferably, the intelligent control unit further includes a communication module for realizing long-distance transmission for test data and/or a check result, and a communication mode of the communication module is wired communication or wireless communication.

More preferably, the wired communication mode includes one or more of a RS232 bus, a RS422 bus, a RS485 bus, a CAN-BUS, 4-20 mA, Hart, IIC, a SPI, a wire, a coaxial cable, a power line carrier (PLC), and a cable.

More preferably, the wireless communication mode includes one or more of NB-IOT, 2G/3G/4G/5G, WIFI, Bluetooth, Lora, Lorawan, Zigbee, infrared ray, ultrasonic wave, acoustic wave, satellite, optical wave, quantum communication, and sonar.

Preferably, at least two of the gas density relays (or gas density monitoring apparatuses) are sequentially connected with a remote background detection system through a hub and a protocol converter; where the gas density relays (or gas density monitoring apparatuses) are arranged on electrical equipment with corresponding gas chambers.

More preferably, a RS485 hub is adopted as the hub.

More preferably, an IEC61850 protocol converter or an IEC104 protocol converter is adopted as the protocol converter.

In the above contents, the self-diagnostic gas density relay generally refers to that the components of the self-diagnostic gas density relay are designed into an integrated structure; and the gas density monitoring apparatus generally refers to that the components of the gas density monitoring apparatus are designed into split structures with flexible composition.

A second aspect of the present application discloses a use method of a self-diagnostic gas density relay, including:

in a normal working state, the gas density relay (or gas density monitoring apparatus) monitors a gas density value in electrical equipment through a gas density detection sensor;

a diagnostic sensor acquires deformation quantities of components that generate deformations, and/or positions or displacement quantities of components that generate displacements when a pressure changes, or a temperature changes, or a gas density changes in a gas density relay body, and sends the acquired data to an intelligent control unit;

the intelligent control unit receives the data acquired by the gas density detection sensor and/or the diagnostic sensor, and diagnose whether a current working state of the gas density relay body is normal or not by judging whether the deformation quantities, and/or the positions, and/or the displacement quantities are within preset thresholds or not, or by comparing the deformation quantities, and/or the positions, and/or the displacement quantities with preset standard values corresponding thereto; or, the intelligent control unit uploads the received data to a background, and the background diagnoses whether the current working state of the gas density relay body is normal or not by judging whether the deformation quantities, and/or the positions, and/or the displacement quantities are within the preset thresholds or not, or by comparing the deformation quantities, and/or the positions, and/or the displacement quantities with preset standard values corresponding thereto.

Preferably, the gas density relay (or gas density monitoring apparatus) further includes a driving contact action mechanism, and the driving contact action mechanism is arranged in or out of a housing of the gas density relay body, and connected with the intelligent control unit, and the driving contact action mechanism is configured to apply an action force to the gas density relay body, directly or indirectly enable the signal action mechanism to generate a displacement, and/or drive the gas density relay body to generate a contact signal action; and the use method further includes:

controlling the driving contact action mechanism through the intelligent control unit to enable the gas density relay body to generate a contact action, where the intelligent control unit can detect the contact action of the gas density relay body, and then on-line simulation or virtual check on the gas density relay body is completed.

More preferably, the intelligent control unit obtains a pressure value P1 and a temperature value T which are acquired by the gas density detection sensor, and a displacement quantity D acquired by the diagnostic sensor, in the case of contact signal action or switching of the gas density relay body, a corresponding pressure value P2 is obtained by calculating or converting according to the displacement quantity D, an equivalent gas pressure value P is obtained by calculating according to the pressure value P1 and the pressure value P2; and a pressure value corresponding to 20° C., i.e., a gas density value P20, is obtained by converting according to the equivalent gas pressure value P and a gas pressure-temperature characteristic, so that on-line check on the gas density relay is completed; or, The intelligent control unit obtains a gas density value P120 acquired by the gas density detection sensor, and a displacement quantity D acquired by the diagnostic sensor, in the case of contact signal action or switching of the gas density relay body, a corresponding gas density value P220 is obtained by calculating or converting in combination with a temperature value T acquired by the temperature sensor, and the gas density value P20 is obtained by calculating according to the gas density value P120 and the gas density value P220, so that on-line check on the gas density relay is completed.

Further, in the case of contact signal action or switching of the gas density relay body, the equivalent gas pressure value $P=P1-P2$; a pressure value corresponding to 20° C., i.e., a gas density value P20, is obtained by converting according to the equivalent gas pressure value P and the gas pressure-temperature characteristic, so that on-line check on the gas density relay is completed; or, Further, in the case of contact signal action or switching of the gas density relay body, the equivalent gas pressure value $P=P1-P2*K$, where K is a preset coefficient; and a pressure value corresponding to 20° C., i.e., a gas density value P20, is obtained by converting according to the equivalent gas pressure value P and the gas pressure-temperature characteristic, so that on-line check on the gas density relay is completed; or, in the case of contact signal action or switching of the gas density relay body, a corresponding relationship among the gas density value P20, the gas density value P120, and the gas density value P220 is pre-set into a data table, and the corresponding gas density value P20 is obtained by querying the data table according to the gas density value P120 and the gas density value P220, so that on-line check on the gas density relay is completed; or, in the case of contact signal action or switching of the gas density relay body, a corresponding relationship among the gas density value P20, the gas pressure value P1, the gas pressure value P2, and the temperature value T is pre-set into a data table, and the corresponding gas density value P20 is obtained by querying the data table according to the gas pressure value P1, the gas pressure value P2, and the temperature value T, so that on-line check on the gas density relay is completed.

More preferably, the gas density relay (or gas density monitoring apparatus) further includes a force measurement sensor, the force measurement sensor is arranged on the driving contact action mechanism or arranged in the housing, connected with the intelligent control unit, and configured to detect a force applied by the driving contact action mechanism on the gas density relay body; and the use method further includes:

the intelligent control unit obtains a pressure value P1 and a temperature value T which are acquired by the gas density detection sensor, and a signal value F acquired by the force measurement sensor, in the case of contact signal action or switching of the gas density relay body, a corresponding equivalent pressure value P3 is obtained by calculating or converting according to the pressure value P1, the temperature value T, and the signal value F, and an equivalent gas pressure value P is obtained by calculating according to the pressure value P1 and the pressure value P3; a pressure value corresponding to 20° C., i.e., a gas density value P20, is obtained by converting according to the equivalent gas pressure value P and the gas pressure-temperature characteristic, so that on-line check on the gas density relay is completed; or, The intelligent control unit obtains a gas density value P120 acquired by the gas density detection sensor, a signal value F acquired by the force measurement sensor, and a temperature value acquired by the temperature sensor, in the case of contact signal action or switching of the gas density relay body, a corresponding equivalent gas density value P320 is obtained by calculating and converting according to the gas density value P120, the signal value F, and the temperature value, and the gas density value P20 is obtained by calculating according to the gas density value P120 and the gas density value P320, so that on-line check on the gas density relay is completed.

Further, in the case of contact signal action or switching of the gas density relay body, the equivalent gas pressure value $P=P1-P3$; and a pressure value corresponding to 20° C., i.e., a gas density value P20, is obtained by converting according to the equivalent gas pressure value P and the gas pressure-temperature characteristic, so that on-line check on the gas density relay is completed; or, in the case of contact signal action or switching of the gas density relay body, the equivalent gas pressure value $P=P1-P3*M$, where M is a preset coefficient; and a pressure value corresponding to 20° C., i.e., a gas density value P20, is obtained by converting according to the equivalent gas pressure value P, the temperature value T, and the gas pressure-temperature characteristic, so that on-line check on the gas density relay is completed; or, in the case of contact signal action or switching of the gas density relay body, a corresponding relationship among the gas density value P20, the gas density value P120, and the gas density value P320 is pre-designed into a data table, and the corresponding gas density value P20 is obtained by querying the data table according to the gas density value P120 and the gas density value P320, so that on-line check on the gas density relay is completed; or, in the case of contact signal action or switching of the gas density relay body, a corresponding relationship among the gas density value P20, the gas pressure value P1, the gas pressure value P3 and the temperature value T is pre-designed into a data table, and the corresponding gas density value P20 is obtained by querying the data table according to the gas pressure value P1, the gas pressure value P3, and the temperature value T, so that on-line check on the gas density relay is completed; or, in the case of contact signal action or switching of the gas density relay body, a corresponding relationship among the gas density value P20, the gas pressure value P1, the signal value F acquired by the force measurement sensor, and the temperature value T is pre-designed into a data table, and the corresponding gas density value P20 is obtained by querying the data table according to the gas pressure value P1, the signal value F acquired by the force measurement sensor, and the temperature value T, so that on-line check on the gas density relay is completed; or, in the case of contact signal action or switching of the gas density relay body, a corresponding relationship among the gas density value P20, the gas pressure value P1, the displacement quantity D acquired by the diagnostic sensor, and the temperature value T is pre-designed into a data table, and the corresponding gas density value P20 is obtained by querying the data table according to the gas pressure value P1, the displacement D acquired by the diagnostic sensor, and the temperature value T, so that on-line check on the gas density relay is completed.

Compared with the prior art, technical solutions in the invention have the following beneficial effects:

1) a self-diagnostic gas density relay is provided, and used for monitoring a gas density of the gas-insulated or arc-extinguished electrical equipment, and at the same time, on-line self-diagnosis for the gas density relay is completed, so that efficiency is increased, no maintenance is realized, operation and maintenance costs are reduced, and safe operation of a power grid is guaranteed;

2) a use method of the self-diagnostic gas density relay is provided, and capable of supporting normal operation of the self-diagnostic gas density relay; and 3) no maintenance for the gas density relay is realized, and then intelligent management for a whole life cycle of the gas density relay is realized: and repair is carried out only in the case of a problem, and no maintenance service is required in the case of no problem.

BRIEF DESCRIPTION OF DRAWINGS

The drawings, which form a part of the application, are used to provide a further understanding of the application, and the illustrative embodiments and descriptions of the application are used to explain the application, and do not constitute undue restrictions on the application. In the drawings.

DETAILED DESCRIPTION

In order to make a purpose, a technical solution and effects of the present invention more clear and definite, the present invention is further described in detail below with reference to the drawings and examples. It should be understood that the specific examples are only used for explaining the present invention, and are not used for defining the present invention.

Embodiment 1

Figure 1:
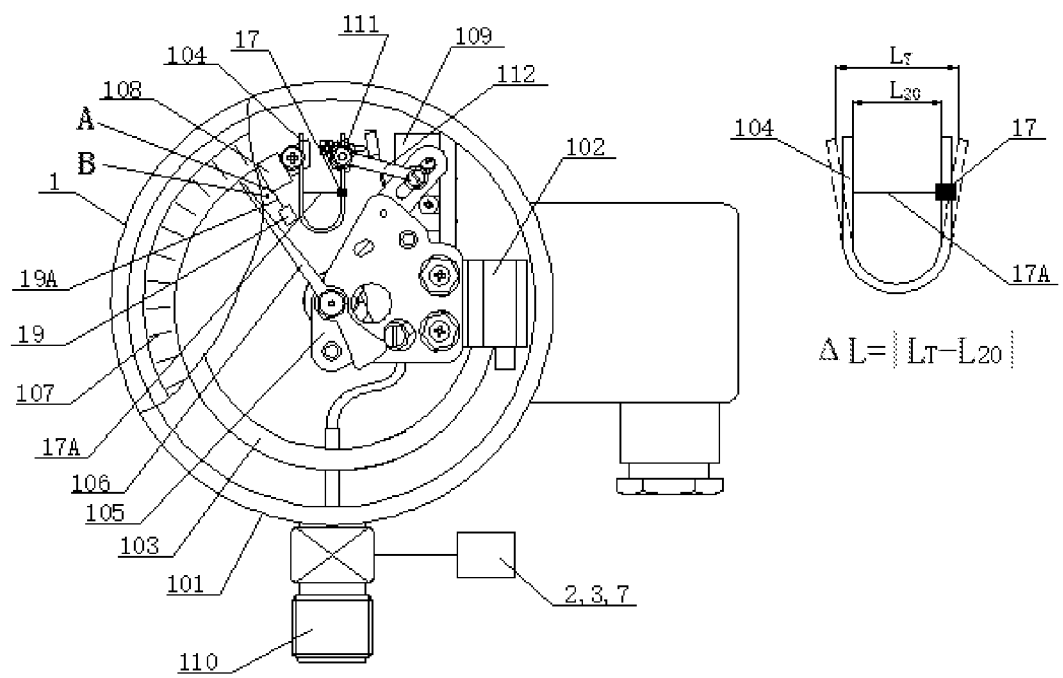
FIG. 1 is a schematic structural diagram of a self-diagnostic gas density relay (or gas density monitoring apparatus) for high-voltage and medium-voltage electrical equipment in an example 1.

As shown in FIG. 1, a self-diagnostic gas density relay (or gas density monitoring apparatus) mainly includes: a gas density relay body 1, a gas density detection sensor (i.e., a pressure sensor 2 and a temperature sensor 3), an intelligent control unit 7, a diagnostic sensor 17 and a diagnostic sensor 19. The pressure sensor 2, the temperature sensor 3, and the intelligent control unit 7 are arranged on a connector 110 for connecting electrical equipment. In a gas path, the pressure sensor 2 of the gas density detection sensor is communicated with the gas density relay body 1. The pressure sensor 2, the temperature sensor 3, the diagnostic sensor 17, and the diagnostic sensor 19 are respectively connected with the intelligent control unit 7. The gas density relay (or gas density monitoring apparatus) further includes a mutual self-check unit, and data detected by the mutual self-check unit is compared through the intelligent control unit 7, so that no maintenance is realized; or, the detected data is compared through the intelligent control unit 7 and the mutual self-check unit, so that no maintenance is realized. In the example, the mutual self-check unit is composed of a comparative pressure value output signal and a pressure sensor 2.

Specifically, the gas density relay body 1 includes a housing 101, and a base 102, an end base 108, a pressure detection element 103, a temperature compensation element 104, a plurality of signal generators 109, a signal action mechanism 111, a core 105, a pointer 106, a connection rod 112, and a dial 107 which are arranged in the housing 101. The diagnostic sensor 17 and the diagnostic sensor 19 are arranged in the housing 101 of the gas density relay body 1, and are respectively connected with the intelligent control unit 7. One end of the pressure detection element 103 is fixed on the base 102 and communicated with the base 102, the other end of the pressure detection element 103 is connected with one end of the temperature compensation element 104 through the end base 108, the other end of the temperature compensation element 104 is provided with the signal action mechanism 111, and an adjusting part (such as an adjusting screw) for pushing the signal generator 109 and connecting or disconnecting a contact of the signal generator 109 is arranged on the signal action mechanism 111. The core 105 is fixed on the base 102; the other end of the temperature compensation element 104 is further connected with the core 105 through the connection rod 112 or directly; and the pointer 106 is installed on the core 105 and arranged in front of the dial 107, and the pointer 106 displays a gas density value in combination with the dial 107. In addition, the gas density relay body 1 may further include a digital device or a liquid crystal device with indicated value display. The signal generator 109 includes a microswitch or a magnetic-assisted electrical contact, and the gas density relay body 1 outputs contact signals through the signal generator 109; the pressure detection element 103 includes a Bourdon tube or a bellows, and the Bourdon tube is adopted in the example; and a temperature compensation sheet or a gas enclosed in the housing is adopted as the temperature compensation element 104, and the temperature compensation sheet is adopted in the example. The gas density relay body 1 in the example may further include: an oil-filled density relay, an oil-free density relay, a gas density meter, a gas density switch, or a gas pressure gauge.

The diagnostic sensor 17 is arranged on the temperature compensation element 104 in the housing 101, and contacts with or is associated with the temperature compensation element 104 through a contact part 17A, the diagnostic sensor 17 is a displacement sensor (or a deformation quantity sensor, or a photoelectric sensor), and the diagnostic sensor 17 is configured to acquire a deformation quantity of the temperature compensation element 104 of the gas density relay body 1, and diagnose a current working state of the gas density relay body 1.

A working principle is as follows: specifically, in the example, the intelligent control unit 7 obtains a temperature value T acquired by the temperature sensor 3 and a deformation quantity $\Delta L$ (compared with an overall dimension at 20° C.) detected by the diagnostic sensor 17 on the temperature compensation element 104 at the temperature, for example, as shown in FIG. 1, the temperature compensation element 104 stretches or retreats under the effect of thermal expansion and cold contraction to compensate for a density value change caused by rise and fall of the temperature. The overall dimension of the temperature compensation element 104 at 20° C. is L20, when the temperature changes, the overall dimension of the temperature compensation element 104 changes and becomes LT, that is, the deformation quantity of the temperature compensation element 104 is $\Delta L=LT-L20$, if the deformation quantity $\Delta L$ is within a preset threshold thereof, a current working state of the temperature compensation element 104 of the gas density relay (or gas density monitoring apparatus) is normal, otherwise, the current working state is abnormal. Further, a temperature change value is $\Delta T$ ($\Delta T=|T-20|°$ C.), and a corresponding relationship between each temperature change value $\Delta T$ and a corresponding preset standard value of the deformation quantity $\Delta L$ ($\Delta L=|LT-L20|$) of the temperature compensation element 104 may be pre-generated into a data table; the intelligent control unit 7 obtains a deformation quantity $\Delta L1$ detected by the diagnostic sensor 17, of the temperature compensation element 104, under the current temperature change, queries the corresponding preset standard value $\Delta L2$ of the deformation quantity, of the current temperature change value in the data table, calculates a difference $|\Delta L1-\Delta L2|$, that is, an error, between the detected deformation quantity $\Delta L1$ and the preset standard value $\Delta L2$, and judges whether the error is within a preset threshold or not, if the error is within the preset threshold, the current working state of the temperature compensation element 104 of the gas density relay (or gas density monitoring apparatus) is normal, otherwise the current working state is abnormal.

The diagnostic sensor 19 is arranged at the end base 108 in the housing 101, and contacts with or is associated with the end base 108 through a contact part 19A, the diagnostic sensor 19 is a displacement sensor (or a deformation quantity sensor, or a photoelectric sensor, or a distance measurement sensor), and the diagnostic sensor 19 is configured to acquire a position or a displacement quantity of the end base 108 of the gas density relay body 1, and diagnose a current working state of the gas density relay body 1. Specifically, in the example, the intelligent control unit 7 obtains a pressure value P acquired by the pressure sensor 2 of the gas density detection sensor, and a position or a displacement quantity $\Delta S$ (for example, compared with a position when the pressure is equal to zero) detected by the diagnostic sensor 19 on the end base 108, under the same gas pressure. For example, as shown in FIG. 1, when the pressure sensor 2 acquires the pressure value P, the corresponding position detected by the diagnostic sensor 19 on the end base 108 is a position A, and if the position A is within a preset threshold thereof, a current working state of the end base 108 of the gas density relay (or gas density monitoring apparatus) is normal, otherwise, the current working state is abnormal. Or, a corresponding relationship between each gas pressure value and a corresponding preset standard value of the position of the end base 108 may be pre-designed into a data table; the intelligent control unit 7 obtains a position S1 detected by the diagnostic sensor 19, of the end base 108, under the current gas pressure, queries the corresponding preset standard value S2 of the current gas pressure value in the data table, calculates a difference $|S1-S2|$, that is, an error, between the detected position S1 and the preset standard value S2, and judges whether the error is within a preset threshold or not, if the error is within the preset threshold, a current working state of the end base 108 of the gas density relay (or gas density monitoring apparatus) is normal, otherwise, the current working state is abnormal. During the pressure calculation, a density relay measurement principle (an absolute pressure or a relative pressure) is combined, and accurate calculation may be carried out in combination with the atmospheric pressure. The end base 108 is welded to one end of the pressure detection element 103 (being a Bourdon tube in the example), which indirectly indicates that the current working state of the pressure detection element 103 (being a Bourdon tube in the example) is normal, otherwise, the current working state is abnormal. Or, when the temperature T=T1 and the pressure value acquired by the pressure sensor 2 is PT1, a corresponding position detected by the diagnostic sensor 19 on the end base 108 is a position A; when the temperature T=T2 and the pressure value acquired by the pressure sensor 2 is PT2, a corresponding position detected by the diagnostic sensor 19 on the end base 108 is a position B, and a distance between the position A and the position B is ΔS, that is to say, a change value caused by temperature is ΔT (ΔT=|T1−T2|), and at the same time, the pressure value also causes a corresponding pressure change value ΔP (ΔP=|PT1−PT2|), then the end base 108 generates a corresponding displacement ΔS, and if the displacement ΔS is within a preset threshold thereof, the current working state of the end base 108 of the gas density relay (or gas density monitoring apparatus) is normal, otherwise, the current working state is abnormal. The end base 108 is welded to one end of the pressure detection element 103 (being a Bourdon tube in the example), which indirectly indicates that the current working state of the pressure detection element 103 (being a Bourdon tube in the example) is normal, otherwise, the current working state is abnormal. Or, that is, the pressure change value ΔP (ΔP=|PT1−PT2|) generated by the pressure value change enables the pressure detection element 103 (being a Bourdon tube in the example) to generate a corresponding deformation quantity, and if the deformation quantity is within a preset threshold thereof, the current working state of the pressure detection element 103 (being a Bourdon tube in the example) is normal, otherwise, the current working state is abnormal. Or, a corresponding relationship between each gas pressure change value and a corresponding preset standard value of the displacement quantity of the end base 108 may be pre-designed into a data table; the intelligent control unit 7 obtains a displacement quantity ΔS1 detected by the diagnostic sensor 19, of the end base 108, under the current gas pressure change, queries the corresponding preset standard value ΔS2 of the current gas pressure change value in the data table, calculates a difference |ΔS1-ΔS2|, that is, an error, between the detected displacement quantity ΔS1 and the preset standard value ΔS2, and judges whether the error is within a preset threshold or not, and if the error is within the preset threshold, the current working state of the end base 108 of the gas density relay (or gas density monitoring apparatus) is normal, otherwise, the current working state is abnormal.

There may be a plurality of the diagnostic sensors, one of the diagnostic sensors may be arranged on the pressure detection element 103, one of the diagnostic sensors may be arranged on the temperature compensation element 104, one of the diagnostic sensors may be arranged on the signal action mechanism 111, and even one of the diagnostic sensors may be arranged on the signal generator 109.

Embodiment 2

Figure 2:
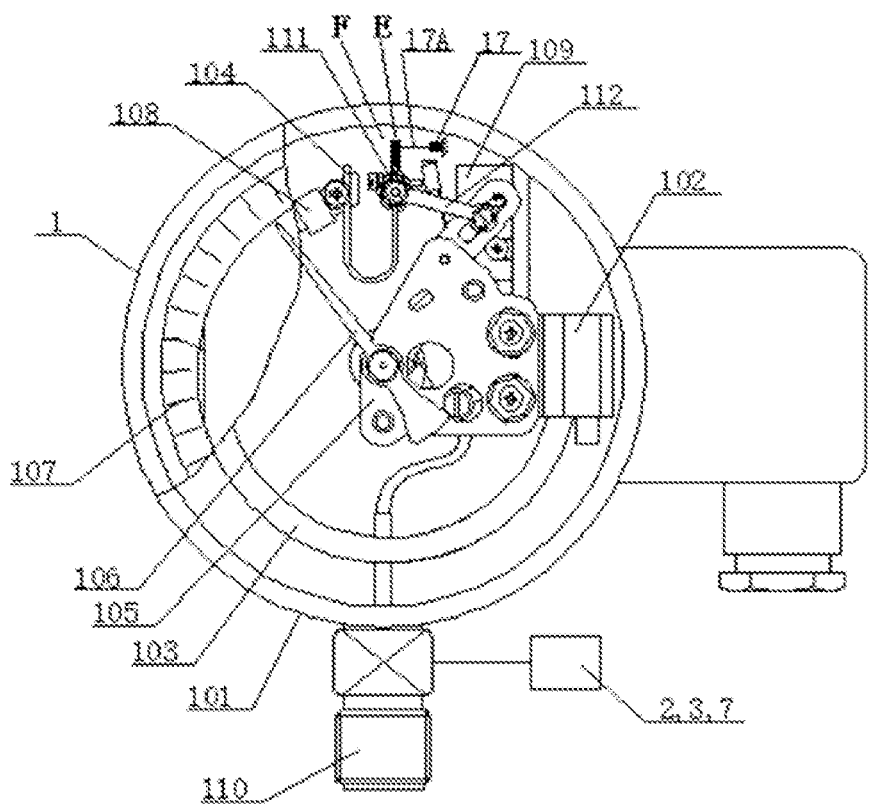
FIG. 2 is a schematic structural diagram of a self-diagnostic gas density relay (or gas density monitoring apparatus) for high-voltage and medium-voltage electrical equipment in an example 2.

As shown in FIG. 2, a self-diagnostic gas density relay (or gas density monitoring apparatus) includes: a gas density relay body 1, a gas density detection sensor (a pressure sensor 2 and a temperature sensor 3), an intelligent control unit 7, and a diagnostic sensor 17. The pressure sensor 2, the temperature sensor 3, and the intelligent control unit 7 are arranged on a connector 110 for connecting electrical equipment. In a gas path, the pressure sensor 2 of the gas density detection sensor is communicated with the gas density relay body 1. The pressure sensor 2, the temperature sensor 3 and the diagnostic sensor 17 are respectively connected with the intelligent control unit 7. The gas density relay (or gas density monitoring apparatus) further includes a mutual self-check unit, and data detected by the mutual self-check unit is compared through the intelligent control unit 7, so that no maintenance is realized; or, the detected data is compared through the intelligent control unit 7 and the mutual self-check unit, so that no maintenance is realized. In the example, the mutual self-check unit is composed of a comparative pressure value output signal and a pressure sensor 2.

Specifically, the gas density relay body 1 includes a housing 101, and a base 102, an end base 108, a pressure detection element 103, a temperature compensation element 104, a plurality of signal generators 109, a signal action mechanism 111, a connection rod 112, a core 105, a pointer 106, and a dial 107 which are arranged in the housing 101. The diagnostic sensor 17 is arranged in the housing 101 of the gas density relay body 1.

The obvious difference from example 1 is that, in the example, the diagnostic sensor 17 is arranged at the signal action mechanism 111 in the housing 101, and contacts with or is associated with the signal action mechanism 111 through a contact part 17A, the diagnostic sensor 17 is a displacement sensor (or a deformation quantity sensor, or a photoelectric sensor), and the diagnostic sensor 17 is configured to acquire a corresponding position or displacement quantity of the signal action mechanism 111 of the gas density relay body 1, and diagnose whether a current working state of the gas density relay body 1 or normal or not. Further, in the example, the intelligent control unit 7 obtains a density value P20 obtained by the pressure sensor 2 and the temperature sensor 3 of the gas density detection sensor, and a corresponding displacement quantity ΔS20 or a corresponding position detected by the diagnostic sensor 17 on the signal action mechanism 111, under the same gas density. For example, as shown in FIG. 2, a corresponding density value P20 is obtained from a pressure value P acquired by the pressure sensor 2 and a temperature value T acquired by the temperature sensor 3, at this moment, a corresponding position detected by the diagnostic sensor 17 on the signal action mechanism 111 is a position E, and if the position E is within a preset threshold thereof, and a current working state of the signal action mechanism 111 of the gas density relay (or gas density monitoring apparatus) is normal, otherwise, the current working state is abnormal. Or, a corresponding relationship between each gas density value and a corresponding preset standard value of the position of the signal action mechanism 111 may be pre-designed into a data table; the intelligent control unit 7 obtains a position S1 detected by the diagnostic sensor 17, of the signal action mechanism 111, under the current gas density, queries the corresponding preset standard value S2 of the current gas density value in the data table, calculates a difference |S1-S2|, that is, an error, between the detected position S1 and the preset standard value S2, and judges whether the error is within a preset threshold or not, and if the error is within the preset threshold, a current working state of the signal action mechanism 111 of the gas density relay (or gas density monitoring apparatus) is normal, otherwise, the current working state is abnormal. During the density calculation, a density relay measurement principle (an absolute pressure or a relative pressure) is combined, and accurate calculation may be carried out in combination with the atmospheric pressure. Or, when a density value obtained by the pressure sensor 2 and the temperature sensor 3 on one day D1 is P20D1, a corresponding position detected by the diagnostic sensor 17 on the signal action mechanism 111 is a position E; when a density value obtained by the pressure sensor 2 and the temperature sensor 3 on another day D2 is P20D2, a corresponding position detected by the diagnostic sensor 17 on the signal action mechanism 111 is a position F; and a distance between the position E and the position F is $\Delta S2$, that is to say, a change value $\Delta P20$ ($\Delta P20=|P20D1-P20D2|$) caused by the density enables the signal action mechanism 111 to generate a corresponding displacement, and if the displacement quantity $\Delta S20$ is within a preset threshold thereof, the current working state of the signal action mechanism 111 of the gas density relay (or gas density monitoring apparatus) is normal, otherwise, the current working state is abnormal. Or, a corresponding relationship between each density change value and a corresponding preset standard value of the displacement quantity of the signal action mechanism 111 may be pre-designed into a data table; the intelligent control unit 7 obtains a displacement quantity $\Delta S1$ detected by the diagnostic sensor 17, of the signal action mechanism 111, under the current gas density change, queries the corresponding preset standard value $\Delta S2$ of the current gas density change value in the data table, calculates a difference $|\Delta S1-\Delta S2|$, that is, an error, between the detected displacement quantity $\Delta S1$ and the preset standard value $\Delta S2$, and judges whether the error is within a preset threshold or not, and if the error is within the preset threshold, a current working state of the signal action mechanism 111 of the gas density relay (or gas density monitoring apparatus) is normal, otherwise, the current working state is abnormal.

Similarly, the gas density relay (or gas density monitoring apparatus) includes a diagnostic sensor 17, and the diagnostic sensor 17 is arranged corresponding to the temperature compensation element 104, or the core 105, or the pointer 106, or the connection rod 112 of the gas density relay body 1. The diagnostic sensor 17 is a displacement sensor (or a deformation quantity sensor, or a photoelectric sensor), and the diagnostic sensor 17 may also be configured to acquire a corresponding position or/and displacement quantity, or a deformation quantity of the temperature compensation element 104, or the core 105, or the pointer 106, or the connection rod 112 of the gas density relay body 1, and diagnose a current working state of the gas density relay body 1. The method is the same as the monitoring of the diagnositic sensor 17 through the signal action mechanism 111.

Embodiment 3

Figure 3:
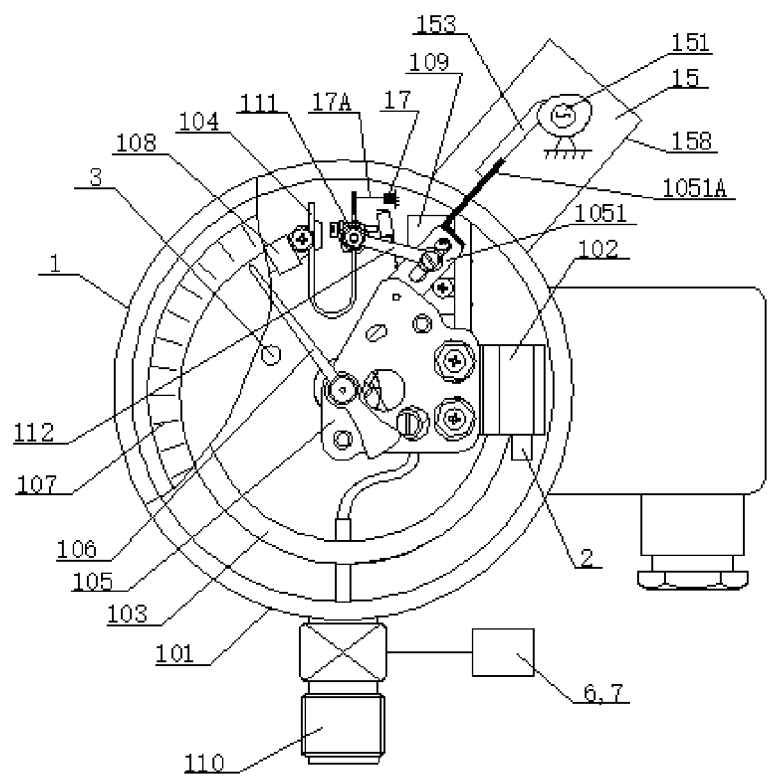
FIG. 3 is a schematic structural diagram of a self-diagnostic gas density relay (or gas density monitoring apparatus) for high-voltage and medium-voltage electrical equipment in an example 3.

As shown in FIG. 3, a self-diagnostic gas density relay (or gas density monitoring apparatus) includes: a gas density relay body 1, a pressure sensor 2, a temperature sensor 3, a driving contact action mechanism 15, an on-line check contact signal sampling unit 6, an intelligent control unit 7 and a diagnostic sensor 17. The on-line check contact signal sampling unit 6 and the intelligent control unit 7 are arranged on a connector 110 for connecting electrical equipment. The driving contact action mechanism 15 is arranged outside a housing 101.

Specifically, the gas density relay body 1 includes the housing 101, and a base 102, an end base 108, a pressure detection element 103, a temperature compensation element 104, a plurality of signal generators 109, a core 105, a pointer 106, and a dial 107 which are arranged in the housing 101. One end of the pressure detection element 103 is fixed on the base 102 and communicated with the base 102, the other end of the pressure detection element 103 is connected with one end of the temperature compensation element 104 through the end base 108, the other end of the temperature compensation element 104 is provided with the signal action mechanism 111, and an adjusting part (such as an adjusting screw) for pushing the signal generator 109 and connecting or disconnecting a contact of the signal generator 109 is arranged on the signal action mechanism 111. The core 105 is fixed on the base 102; and the pointer 106 is installed on the core 105 and arranged in front of the dial 107, and the pointer 106 displays a gas density value in combination with the dial 107. The core 105 includes a sector gear 1051 and a center gear, and the sector gear 1051 is meshed with the center gear. The other end of the temperature compensation element 104 is connected with one end of the sector gear 1051 through the connection rod 112. One end of the sector gear 1051 is fixedly connected with one end of a contact part 1051A of the sector gear, and the other end of the contact part 1051A of the sector gear stretches out of the housing 101 from a gas hole of the housing 101 of the gas density relay body 1. One end of the sector gear 1051 moves, and the other end, meshed with the center gear, of the sector gear 1051, drives the center gear to rotate, the center gear and the pointer 106 are installed on a drive rod, and rotation of the center gear drives the drive rod to rotate, so that the pointer 106 moves and indicates a scale on the dial 107.

The pressure sensor 2 is arranged on the base 102, and the temperature sensor 3 is arranged in the housing 101. The diagnostic sensor 17 is arranged at the temperature compensation element 104 in the housing 101, and contacts with or is associated with the temperature compensation element 104 through a contact part 17A; or, the diagnostic sensor 17 may be arranged at the signal action mechanism 111 in the housing 101, and contacts with or is associated with the signal action mechanism 111 through the contact part 17A. The pressure sensor 2, the temperature sensor 3, the on-line check contact signal sampling unit 6 and the diagnostic sensor 17 are respectively connected with the intelligent control unit 7; and the on-line check contact signal sampling unit 6 is further connected with the signal generator 109.

The difference from example 1 is that:

1) the diagnostic sensor 17 in the example is a displacement sensor (or a deformation quantity sensor, or a photoelectric sensor). The diagnostic sensor 17 detects the corresponding position of the temperature compensation element 104, and if the position is within a preset threshold thereof, the current working state of the temperature compensation element 104 of the gas density relay (or gas density monitoring apparatus) is normal, otherwise, the current working state is abnormal. Or, the gas density change value $\Delta P20$ generated by the gas density value change enables the temperature compensation element 104 to generate a corresponding displacement, the diagnostic sensor 17 detects the displacement quantity $\Delta S20$, and if the displacement quantity $\Delta S20$ is within a preset threshold thereof, the current working state of the temperature compensation element 104 of the gas density relay (or gas density monitoring apparatus) is normal, otherwise, the current working state is abnormal. Or, a corresponding relationship between each density change value and a corresponding preset standard value of the displacement quantity of the temperature compensation element 104 may be pre-designed into a data table; the intelligent control unit 7 obtains a displacement quantity $\Delta S1$ detected by the diagnostic sensor 17, of the temperature compensation element 104, under the current gas density change, queries the corresponding preset standard value $\Delta S2$ of the current gas density change value in the data table, calculates a difference $|\Delta S1-\Delta S2|$, that is, an error, between the detected displacement quantity $\Delta S1$ and the preset standard value $\Delta S2$, and judges whether the error is within a preset threshold or not, and if the error is within the preset threshold, the current working state of the temperature compensation element 104 of the gas density relay (or gas density monitoring apparatus) is normal, otherwise, the current working state is abnormal. That is, the intelligent control unit 7 judges according to the density value acquired under the same gas density, and the corresponding position or/and displacement quantity detected by the diagnostic sensor 17 on the temperature compensation element 104 to obtain whether a current working state of a monitored part of the gas density relay is normal or not.

2) The driving contact action mechanism 15 is arranged outside the housing 101, and arranged opposite to the contact part 1051A of the sector gear of the core 105 of the gas density relay body 1; and the driving contact action mechanism 15 is configured to apply an action force to the sector gear 1051 of the gas density relay body 1, and indirectly enables the signal action mechanism 111 to generate a displacement, and an adjusting part (such as an adjusting screw) on the signal action mechanism 111 pushes the signal generator 109, and connects or disconnects a contact of the signal generator 109, so that the gas density relay body 1 is driven to generate a contact signal action.

The drive contact action mechanism 15 mainly includes a drive component 151, a push rod (force application part) 153 and an outer cover 158; where the push rod (force application part) 153 is arranged opposite to the contact part 1051A of the sector gear. When the drive component 151 does not apply a force, the push rod (force application part) 153 is away from the contact part 1051A of the sector gear, and the push rod 153 does not apply a force on the contact part 1051A of the sector gear. During qualitative check, the drive component 151 applies a force F on the contact part 1051A of the sector gear through the push rod 153 to enable the sector gear 1051 to generate a corresponding displacement, the signal action mechanism 111 is driven to generate a displacement by the aid of the connection rod 112 and the temperature compensation element 104, and an adjusting part (such as an adjusting screw) on the signal action mechanism 111 pushes the signal generator 109, and connects or disconnects a contact of the signal generator 109, so that the gas density relay body 1 is driven to generate a contact signal action. At the same time, the intelligent control unit 7 obtains a pressure value P1 acquired by the pressure sensor 2 and a temperature value T acquired by the temperature sensor 3, in the case of contact signal action or switching of the gas density relay body 1, and a pressure value corresponding to 20° C., i.e. a gas density value P20, is obtained by converting according to the pressure value P1, the temperature value T and the gas pressure-temperature characteristic, so that qualitative on-line check on the gas density relay is completed; it is indicated that the contact of gas density relay body 1 is a contact capable of outputting, and an execution mechanism for the contact is reliable, smooth and feasible.

In the example, judgment is carried out through the corresponding position or/and displacement quantity detected by the diagnostic sensor 17 on the temperature compensation element 104 to obtain the current working state of the monitored part of the gas density relay, and the accuracy is qualified; and then the components of the gas density relay body 1 are enabled to generate corresponding displacements through the driving contact action mechanism 15, and/or the gas density relay body 1 is driven to generate a contact signal action, and an execution mechanism for the contact of the gas density relay body 1 is verified to be normal.

Example 4

Figure 4:
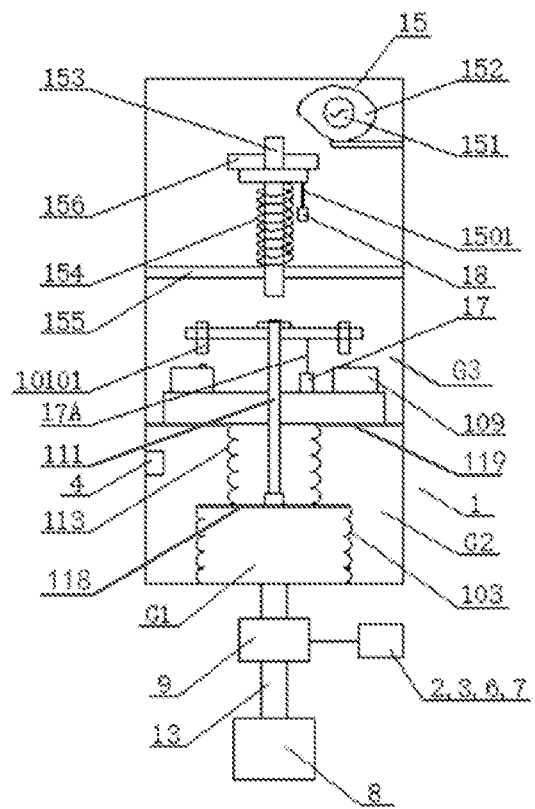
FIG. 4 is a schematic structural diagram of a self-diagnostic gas density relay (or gas density monitoring apparatus) for high-voltage and medium-voltage electrical equipment in an example 4.

As shown in FIG. 4, the self-diagnostic gas density relay (or gas density monitoring apparatus) in example 4 of the present invention includes: a gas density relay body 1, a pressure sensor 2, a temperature sensor 3, a driving contact action mechanism 15, an on-line check contact signal sampling unit 6, an intelligent control unit 7, a multi-way connector 9, a diagnostic sensor 17, a force measurement sensor 18 and a connector 13 for electrical equipment. The gas density relay body 1, the pressure sensor 2, the temperature sensor 3, the on-line check contact signal sampling unit 6 and the intelligent control unit 7 are arranged on the multi-way connector 9.

Specifically, the gas density relay body 1 mainly includes: a housing, and a first bellow 103 (i.e., a pressure detection element), a second bellow 113, a signal generator 109 (being a microswitch in the example), and a signal action mechanism 111 in the housing. A first open end of the first bellow 103 is fixed on an inner wall of the housing, a second open end of the first bellow 103 is connected with a first sealing part 118 in a sealed manner, an inner wall of the first bellow 103, the first sealing part 118, and the inner wall of the housing form a first sealing gas chamber G1 in an encircling manner, and the pressure sensor 2 is communicated with the first sealing gas chamber G1. The first sealing gas chamber G1 is communicated with insulating gas of the electrical equipment 8 through the multi-way connector 9 and the connector 13 for the electrical equipment. A first open end of the second bellow 113 is connected with the first sealing part 118 in a sealed manner, a second open end of the second bellow 113 is connected with the inner wall of the housing through a second sealing part 119, an outer wall of the first bellow 103, the first sealing part 118, an outer wall of the second bellow 113, the second sealing part 119 and the inner wall of the housing form a second sealing gas chamber G2 in an encircling manner, and the second sealing gas chamber G2 is filled with standard compensation gas with a density value of P20BC, that is, the second sealing gas chamber G2 is a standard gas chamber for temperature compensation, the temperature compensation element is formed, and the second pressure sensor 4 is arranged in the second sealing gas chamber G2, and used for detecting a gas pressure in the second sealing gas chamber G2. An inner wall of the second bellow 113, the second sealing part 119 and the inner wall of the housing form a third gas chamber G3 in an encircling manner. The signal generator 111 and the signal action mechanism 109 are arranged in the third gas chamber G3. The signal action mechanism 111 is connected with the first sealing part 118, the signal generator 109 is arranged corresponding to the signal action mechanism 111, and the gas density relay body 1 outputs contact signals through the signal generator 109. In the example, the signal action mechanism 111 includes a moving rod, one end of the moving rod stretches into the second bellow 113, is fixedly connected with the first sealing part 118, and generates a displacement with the deformation of the first bellow 103; and the other end of the moving rod stretches out of the second bellow 113, and is fixedly connected with an adjusting fixing part (such as a cross rod, or a plate), and an adjusting screw 10101 is arranged on the adjusting and fixing part, and arranged corresponding to the signal generator 109. The gas density is monitored through the first sealing gas chamber G1 and the second sealing gas chamber G2, monitoring for the gas density is realized in combination with the signal generator 109, and when the gas density is lower than or/and higher than a set gas density, an alarm contact signal or/and a blocking contact signal are output through the signal generator 109.

In the example, the diagnostic sensor 17 is arranged below the signal action mechanism 111 and arranged opposite to the signal action mechanism 111, and contacts with or is associated with the signal action mechanism 111 through the contact part 17A, and the diagnosis sensor 17 is configured to acquire the corresponding position or/and displacement quantity of the signal action mechanism 111 of the gas density relay body 1, and diagnose the current working state of the gas density relay body 1. The diagnostic sensor 17 detects the corresponding position of the signal action mechanism 111, and if the position is within a preset threshold thereof, the current working state of the signal action mechanism 111 of the gas density relay (or gas density monitoring apparatus) is normal, otherwise, the current working state is abnormal. Or, the density change value ΔP20 generated by the gas density value change enables the signal action mechanism 111 to generate a corresponding displacement, the diagnostic sensor 17 detects the displacement quantity ΔS20, and if the displacement quantity ΔS20 is within a preset threshold thereof, the current working state of the signal action mechanism 111 of the gas density relay (or gas density monitoring apparatus) is normal, otherwise, the current working state is abnormal. Or, a corresponding relationship between each density change value and a corresponding preset standard value of the displacement quantity of the signal action mechanism 111 may be pre-designed into a data table; the intelligent control unit 7 obtains a displacement quantity ΔS1, detected by the diagnostic sensor 17, of the signal action mechanism 111, under the current gas density change, queries the corresponding preset standard value ΔS2 of the current gas density change value in the data table, calculates a difference |ΔS1−ΔS2|, that is, an error, between the detected displacement quantity ΔS1 and the preset standard value ΔS2, and judges whether the error is within a preset threshold or not, and if the error is within the preset threshold, the current working state of the signal action mechanism 111 of the gas density relay (or gas density monitoring apparatus) is normal, otherwise, the current working state is abnormal. That is, the intelligent control unit 7 judges according to the density value acquired under the same gas density, and the corresponding position or/and displacement quantity detected by the diagnostic sensor 17, of the signal action mechanism 111 to obtain whether a current working state of a monitored part of the gas density relay is normal or not.

The driving contact action mechanism 15 is arranged above the signal action mechanism 111 of the gas density relay body 1, and configured to apply an action force on the signal action mechanism 111 to push the moving rod to move, balance of a force applied by the first sealing gas chamber G1 and the third gas chamber G3 on an upper end surface of the first bellow 103 is broken, and the first bellow 103 generates a deformation with the movement of the moving rod to generate a certain displacement. The moving rod drives the adjusting screw 10101 to trigger a button of the signal generator 109, and the signal generator 109 sends out alarm and blocking signals.

In the example, the driving contact action mechanism 15 includes a force application mechanism and a movement mechanism, and the force application mechanism drives the movement mechanism to move. The force application mechanism includes a drive component 151 and a force transmission part 152 (being a cam in the example, and the cam rotates under driving of the drive component 151) driven by the drive component 151; and the movement mechanism includes a push rod 153, a fixing part 156 is arranged at one end, close to the force application mechanism, of the push rod 153, and the other end of the push rod 153 penetrates through a fixed frame 155 fixed into the housing of the gas density relay body 1, and is directly opposite to the moving rod of the signal action mechanism 111. A reset spring 154 is arranged on the push rod 153 between the fixing part 156 and the fixed frame 155 in a sleeved manner, that is, the push rod 153 carries out vertical reciprocating movement under the action of the force application mechanism. The force measurement sensor 18 (being a displacement sensor or a deformation quantity sensor in the example) is connected with the push rod 153 through a contact part 1501, or, the force measurement sensor 18 may also be connected with the push rod 153 directly. When the force application mechanism does not apply a force, under the action of the reset spring 154, the push rod 153 is away from the moving rod of the signal action mechanism 111, and the push rod 153 does not apply a force on the moving rod of the signal action mechanism 111. When the force application mechanism applies a force, the push rod 153 is subjected to the action of the drive component 151 and the force transmission part 152, and an action force F on the reset spring 154, of the push rod 153, may be obtained by detecting a deformation quantity of the reset spring 154 through the force measurement sensor 18 ($F=L*N$, where L is the deformation quantity, mm; and N is an elastic coefficient, kg/mm). During check, the force transmission part 152 rotates under the driving of the drive component 151, the push rod 153 is pushed to move downwards, then an action force F is applied on the spring 154 and the signal action mechanism 111, that is, the drive component 151 applies an action force F on the signal action mechanism 111 through the force transmission part 152, so that the gas density relay body 1 generates a contact signal action.

The drive component 151 includes, but is not limited to, one of a magnetic drive mechanism, gravity, a motor, a reciprocating movement mechanism, a Carnot cycle mechanism, an air compressor, a compressor, a gas release valve, a pressure making pump, a booster pump, a booster valve, an electric air pump, an electromagnetic air pump, a pneumatic element, a magnetic coupling thrust mechanism, a heating thrust generation mechanism, a mechanism generating thrust with electrical heating, and a mechanism generating thrust with chemical reaction; and the force transmission part 152 includes, but is not limited to, one of a cam, a connecting rod, a spring, a metal part, a non-metal part, an expansion part and a non-expansion part. The force measurement sensor 18 is connected with the driving contact action mechanism 15 or the signal action mechanism 111; the force measurement sensor 18 is further connected with the intelligent control unit 7; the force measurement sensor 18 is configured to detect a force F applied by the driving contact action mechanism 15 on the signal action mechanism 111; and the force measurement sensor 18 includes, but is not limited to, one of a gravity sensor, a pressure sensor, a magnetic sensor, a displacement sensor, a deformation quantity sensor, a photoelectric sensor, an angle sensor, a deformation sheet sensor, a force measurement sensor, and a camera.

The intelligent control unit 7 obtains a pressure value P1 acquired by the pressure sensor 2, a temperature value T acquired by the temperature sensor 3, and a force F acquired by the force measurement sensor, in the case of contact signal action or switching of the gas density relay body 1, a corresponding pressure value P2 is obtained by calculating or converting according to the force F, and an equivalent gas pressure value P is obtained by calculating according to the pressure value P1 and the pressure value P2; and a pressure value corresponding to 20° C., i.e., a gas density value P20, is obtained by converting according to the equivalent gas pressure value P and the gas pressure-temperature characteristic, so that on-line check on the gas density relay is completed. Or, the intelligent control unit 7 obtains a gas density value P120 acquired by the pressure sensor 2 and the temperature sensor 3, and a force F acquired by the force measurement sensor 18, in the case of contact signal action or switching of the gas density relay body 1, a corresponding gas density value P220 is obtained by calculating or converting in combination with a temperature value T acquired by the temperature sensor, and the gas density value P20 is obtained by calculating according to the gas density value P120 and the gas density value P220, so that on-line check on the gas density relay is completed. Further, in the case of contact signal action or switching of the gas density relay body 1, the equivalent gas pressure value P=P1−P2; a pressure value corresponding to 20° C., i.e., a gas density value P20, is obtained by converting according to the equivalent gas pressure value P and the gas pressure-temperature characteristic, so that on-line check on the gas density relay is completed; or, in the case of contact signal action or switching of the gas density relay body 1, the equivalent gas pressure value P=P1−P2*M, where M is a preset coefficient, and obtained according to a characteristic of the density relay body; and a pressure value corresponding to 20° C., i.e., a gas density value P20, is obtained by converting according to the equivalent gas pressure value P, the temperature value T and the gas pressure-temperature characteristic, so that on-line check on the gas density relay is completed. Or, in the case of contact signal action or switching of the gas density relay body 1, a corresponding relationship among the gas density value P20, the gas density value P120, and the gas density value P220 is pre-designed into a data table, and the corresponding gas density value P20 is obtained by querying the data table according to the gas density value P120 and the gas density value P220, so that on-line check on the gas density relay is completed; or, in the case of contact signal action or switching of the gas density relay body 1, a corresponding relationship among the gas density value P20, the gas pressure value P1, the gas pressure value P2, and the temperature value T is pre-designed into a data table, and the corresponding gas density value P20 is obtained by querying the data table according to the gas pressure value P1, the gas pressure value P2, and the temperature value T, so that on-line check on the gas density relay is completed.

In the example, the detected corresponding position or/and displacement quantity of the signal action mechanism 111 is judged through the diagnostic sensor 17 to obtain the current working state of the monitored part of the gas density relay, and the accuracy is qualified; and then the components of the gas density relay body 1 are enabled to generate corresponding displacements through the driving contact action mechanism 15, and/or the gas density relay body 1 is driven to generate a contact signal action, and an execution mechanism for the contact of the gas density relay body 1 is verified to be normal.

Embodiment 5

Figure 5:
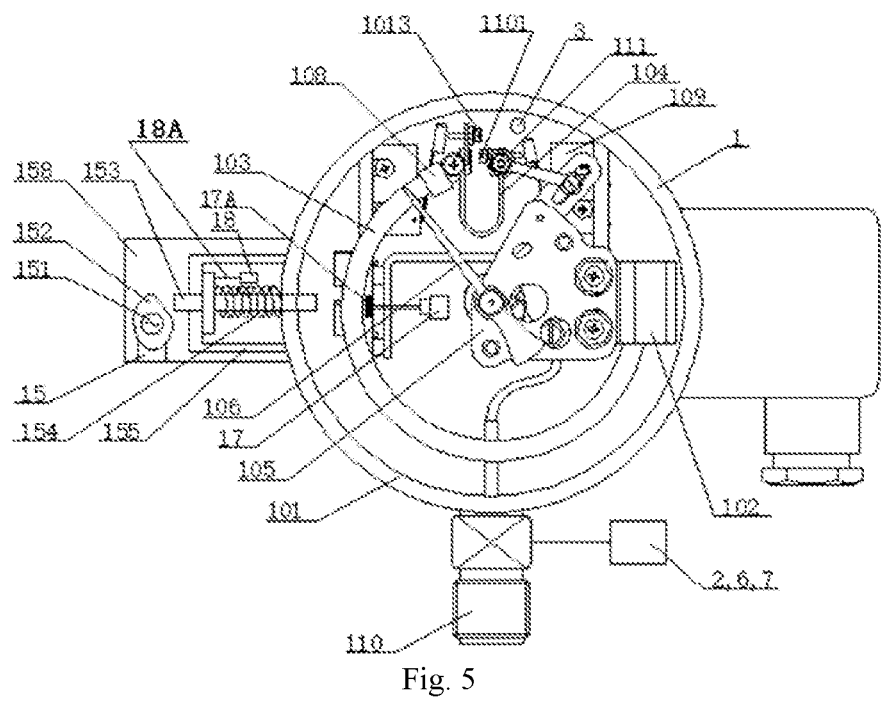
FIG. 5 is a schematic structural diagram of a self-diagnostic gas density relay (or gas density monitoring apparatus) for high-voltage and medium-voltage electrical equipment in an example 4.

As shown in FIG. 5, the gas density relay (or gas density monitoring apparatus) according to example 5 of the present invention includes: a gas density relay body 1, a pressure sensor 2, a temperature sensor 3, a simulation or virtual contact output signal, a diagnostic sensor 17, a force measurement sensor 18, a driving contact action mechanism 15, an on-line check contact signal sampling unit 6 and an intelligent control unit 7. The pressure sensor 2, the on-line check contact signal sampling unit 6 and the intelligent control unit 7 are arranged on a connector 110 for connecting electrical equipment; in a gas path, the pressure sensor 2 is communicated with the gas density relay body 1; the force measurement sensor 18 and the driving contact action mechanism 15 are arranged outside a housing 101 of the gas density relay body 1; the temperature sensor 3 is arranged in the housing 101 of the gas density relay body 1 and close to the temperature compensation element 104, or the temperature sensor 3 is directly arranged on the temperature compensation element 104; the pressure sensor 2, the temperature sensor 3, the on-line check contact signal sampling unit 6, the diagnostic sensor 17, the force measurement sensor 18 and the driving contact action mechanism 15 are respectively connected with intelligent control unit 7; and the on-line check contact signal sampling unit 6 is further connected with a signal generator 109 of the gas density relay body 1.

Embodiment 1

1) the diagnostic sensor 17 is arranged at a right side of (or below) the pressure detection element 103, and arranged opposite to the pressure detection element 103, and the diagnostic sensor 17 contacts with or is associated with the pressure detection element 103 through a contact part 17A. The diagnostic sensor 17 is configured to acquire a corresponding position or displacement quantity of the pressure detection element 103 of the gas density relay body 1, and diagnose whether a current working state of the gas density relay body 1 is normal or not. The diagnostic sensor 17 detects the corresponding position of the pressure detection element 103, and if the position is within a preset threshold thereof, the current working state of the pressure detection element 103 is normal, otherwise, the current working state is abnormal. Or, the change value $\Delta P$ generated by the pressure change enables the pressure detection element 103 to generate a corresponding displacement, the diagnostic sensor 17 detects the displacement quantity $\Delta S$, and if the displacement quantity $\Delta S$ is within a preset threshold thereof, the current working state of the pressure detection element 103 (Bourdon tube) is normal, otherwise the current working state is abnormal. Or, a corresponding relationship between each gas pressure change value and a corresponding preset standard value of the displacement quantity of the pressure detection element 103 may be pre-designed into a data table; the intelligent control unit 7 obtains a displacement quantity $\Delta S1$ detected by the diagnostic sensor 19, of the pressure detection element 103, under the current gas pressure change, queries the corresponding preset standard value $\Delta S2$ of the current gas pressure change value in the data table, calculates a difference $|\Delta S1-\Delta S2|$, that is, an error, between the detected displacement quantity $\Delta S1$ and the preset standard value $\Delta S2$, and judges whether the error is within a preset threshold or not, and if the error is within the preset threshold, the current working state of the pressure detection element 103 is normal, otherwise, the current working state is abnormal. That is, the intelligent control unit 7 judges according to the pressure value acquired under the same gas pressure, and the corresponding position or/and displacement quantity detected by the diagnostic sensor 17 on the pressure detection element 103, to obtain whether a current working state of a monitored part of the gas density relay is normal or not.

2) The driving contact action mechanism 15 is arranged outside the housing 101, and arranged corresponding to the pressure detection element 103 (Bourdon tube) of the gas density relay body 1; and the driving contact action mechanism 15 is configured to enable the signal action mechanism 111 of the gas density relay body 1 to generate a corresponding displacement, and then the gas density relay body 1 is enabled to generate a contact signal action.

The drive contact action mechanism 15 includes an outer cover 158 with an opening in one end, and a drive component 151, a force transmission part 152 (a cam), a push rod 153, a spring 154 and a fixed frame 155 which are arranged in the outer cover 158; where the opening of the outer cover 158 faces the housing 101 of the gas density relay body 1, and the push rod 153 is arranged opposite to the pressure detection element 103 (Bourdon tube) in the housing 101. The force measurement sensor 18 (being a pressure sensor, or a displacement sensor, or a deformation quantity sensor, or a photoelectric sensor, or a deformation sheet sensor in the example) is arranged opposite to the pressure detection element 103 (Bourdon tube), where a force contact part 18A of the force measurement sensor 18 contacts with the pressure detection element 103 (Bourdon tube). and a force F applied by the push rod 153 on the pressure detection element 103 (Bourdon tube) can be detected through the force measurement sensor 18.

The force transmission part 152 rotates under the drive of the drive component 151; the fixed frame 155 is fixedly arranged on the housing 101 of the gas density relay body 1; one end, close to the force transmission part 152, of the push rod 153 penetrates through the fixed frame 155, one end, away from the force transmission part 152, of the push rod 153 stretches out from the opening of the outer cover 158, and then stretches into the housing 101 through a gas hole in the housing 101 of the gas density relay body 1 and contacts with an inner wall of the housing 101 in a sealed manner, and an end part, stretching into the housing 101, of the push rod 153 is arranged opposite to the pressure detection element 103 (Bourdon tube) in the housing 101. A reset spring 154 is arranged on the push rod 153 between the fixed frame 155 and the gas hole of the housing 101 in a sleeved manner, one end of the reset spring 154 is fixedly connected with the fixed frame 155, and the other end of the reset spring 154 is fixedly connected with the housing 101. When the push rod 153 is under no force, an end surface, opposite to a convex part of the force transmission part 152 (cam), on the force transmission part 152 (cam), contacts the end, penetrating through the fixed frame 155, of the push rod 153, the reset spring 154 is in a naturally-stretching state, and the part, stretching into the housing 101, of the push rod 153, is located at one side of the pressure detection element 103 (Bourdon tube) of the gas density relay body 1 and not in contact with the pressure detection element 103 (Bourdon tube), that is, the push rod 153 does not apply a force on the pressure detection element 103 (Bourdon tube).

During check, the drive component 151 (motor) drives the force transmission part 152 (cam) to rotate, the convex part of the force transmission part 152 (cam) strikes the push rod 153, and drives the push rod 153 to move in the axial direction of the push rod 153, the push rod 153 applies a force F on the pressure detection element 103 (Bourdon tube), the end base 108 at a tail end of the pressure detection element 103 (Bourdon tube) is forced to generate a displacement, the signal action mechanism 111 is enabled to generate a displacement with the aid of the temperature compensation element 104, an adjusting part (such as an adjusting screw) on the signal action mechanism 111 pushes the signal generator 109 (such as a microswitch), and a contact of the signal generator 109 is connected to send out a corresponding contact signal (alarm or blocking). Then, when the convex part of the force transmission part 152 (cam) leaves the end, penetrating through the fixed frame 155, of the push rod 153, the push rod 153 is reset under action of an elastic force of the reset spring 154, and does not apply an action force on the pressure detection element 103 (Bourdon tube) any more, the temperature compensation element 104 is reset, the adjusting part is away from the signal generator 109, the contact of the signal generator 109 is disconnected, and the contact signal (alarm or blocking) is released.

The intelligent control unit 7 obtains a pressure value P1 acquired by the pressure sensor, a temperature value T acquired by the temperature sensor, and a force F acquired by the force measurement sensor 18, in the case of contact signal action or switching of the gas density relay body 1, a corresponding pressure value P2 is obtained by calculating or converting according to the force F, and an equivalent gas pressure value P is obtained by calculating according to the pressure value P1 and the pressure value P2; and a pressure value corresponding to 20° C., i.e. a gas density value P20, is obtained by converting according to the equivalent gas pressure value P and the gas pressure-temperature characteristic, so that on-line check on the gas density relay is completed.

In the example, judgment is carried out through the corresponding position or/and displacement quantity detected by the diagnostic sensor 17 on the pressure detection element 103 to obtain the current working state of the monitored part of the gas density relay, and the accuracy is qualified; and then the components of the gas density relay body 1 are enabled to generate corresponding displacements through the driving contact action mechanism 15, and/or the gas density relay body 1 is driven to generate a contact signal action, and an execution mechanism for the contact of the gas density relay body 1 is verified to be normal.

Embodiment VI

Figure 6:
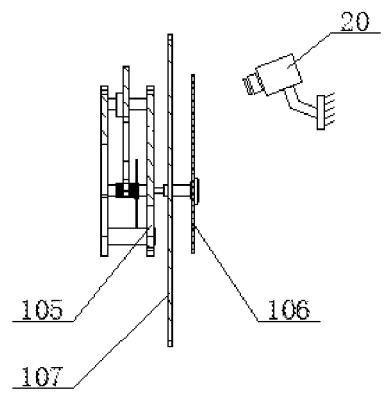
FIG. 6 is a partial schematic diagram of a diagnostic sensor of a self-diagnostic gas density relay (or gas density monitoring apparatus) for high-voltage and medium-voltage electrical equipment in an example 6.

FIG. 6 is a partial schematic diagram of a diagnostic sensor of a self-diagnostic gas density relay (or gas density monitoring apparatus) according to an example 6. As shown in FIG. 6, the diagnostic sensor is a camera 20, and the camera 20 is arranged in or out of the housing of the gas density relay body 1, arranged opposite to the pointer 106 and the dial 107, and further connected with the intelligent control unit 7. The camera 20 obtains a pointer display value or a digital display value of gas density relay body 1 through a head image recognition technology, the pointer display value or the digital display value is a first density value PZ20, a gas density value acquired by the gas density detection sensor is a second density value PJ20, and the intelligent control unit 7 or the background compares the first density value PZ20 with the second density value PJ20 to obtain a density difference |PJ20−PZ20|; and if the density difference |PJ20−PZ20| is within a preset threshold thereof, the current working state of the monitored part of the gas density relay (or gas density monitoring apparatus) is normal, and maintenance is not required, otherwise, the current working state is abnormal.

Embodiment VII

Figure 7:
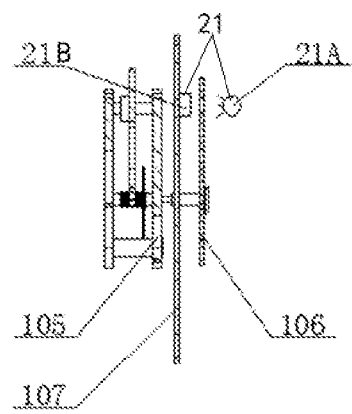
FIG. 7 is a partial schematic diagram of a diagnostic sensor of a self-diagnostic gas density relay (or gas density monitoring apparatus) for high-voltage and medium-voltage electrical equipment in an example 7.

FIG. 7 is a partial schematic diagram of a diagnostic sensor of a self-diagnostic gas density relay (or gas density monitoring apparatus) according to an example 7. As shown in FIG. 7, the diagnostic sensor is a photoelectric sensor 21, and the photoelectric sensor 21 is arranged in a housing of a gas density relay body 1, and connected with an intelligent control unit 7. The photoelectric sensor 21 includes a receiving host 21B and a light-emitting part 21A, the receiving host 21B is arranged on a dial 107, and the light-emitting part 21A is arranged on a pointer 106. When the pointer 106 passes through the light-emitting part 21A of the photoelectric sensor 21, the receiving host 21B of the photoelectric sensor 21 cannot receive light emitted by the light-emitting part 21A, at this moment, the receiving host 21B sends a signal, the intelligent control unit 7 knows that the pointer 106 is located at a set density value PS20 through the signal, and at the same time, a density value acquired by the gas density detection sensor is PJ20, and the intelligent control unit 7 or the background compares the density value PS20 with the density value PJ20 to obtain a density difference |PJ20−PS20|; and if the density difference |PJ20−PS20| is within a preset threshold thereof, the current working state of the monitored part of the gas density relay (or gas density monitoring apparatus) is normal, and no maintenance is realized, otherwise, the current working state is abnormal.

The example may further be designed as follows: the dial 107 is provided with an open hole, and when the photoelectric sensor 21 is not aligned with the pointer 106, the light emitted by the photoelectric sensor 21 is not reflected back immediately; when the photoelectric sensor 21 is aligned with the pointer 106, the light emitted by the photoelectric sensor 21 is reflected back by the pointer 106 immediately, at this moment, the photoelectric sensor 21 sends a signal, the intelligent control unit 7 knows that the pointer 106 is located at a set density value PS20 through the signal, and at the same time, a gas density value acquired by the gas density detection sensor is PJ20, and the intelligent control unit 7 or the background compares the density value PS20 with the density value PJ20 to obtain a density difference |PJ20−PS20|; and if the density difference |PJ20−PS20| is within a preset threshold thereof, the current working state of the monitored part of the gas density relay (or gas density monitoring apparatus) is normal, and maintenance is not required, otherwise, the current working state is abnormal.

The above gas density relay can compare error performance thereof at different temperatures and in different time periods. That is, comparison in different periods and within the same temperature range is carried out, so that performance of the electrical equipment and the gas density relay is judged. A comparison among different historical periods, and a comparison between the history and the present are included. The gas density relay can further be examined. The gas density relay may be repeatedly verified for a plurality of times (such as twice to 3 times), and then an average value is calculated according to a check result of each time. On-line check may be carried out on the gas density relay at any time when necessary.

The type of the above pressure sensor 2 includes an absolute pressure sensor, a relative pressure sensor, or an absolute pressure sensor and a relative pressure sensor, and there may be a plurality of the pressure sensor 2. The form of the pressure sensor may be a diffused-silicon pressure sensor, an MEMS pressure sensor, a chip-type pressure sensor, a coil-induced pressure sensor (such as a Bourdon tube pressure sensor with an inducting coil), and a resistance pressure sensor (such as a Bourdon tube pressure sensor with a slide-wire resistance), and may be an analog-quantity pressure sensor or a digital-quantity pressure sensor. Pressure acquisition uses various pressure sensing elements such as a pressure sensor and a pressure transmitter, for example, the type of diffusion silicon, sapphire, piezoelectricity and a strain gage (the type of a resistance strain gage and a ceramic strain gage).

The above temperature sensor 3 may be a thermocouple, a thermistor and a semiconductor type, may be a contact type and a non-contact type, and may be a thermal resistor and a thermocouple. To sum up, various temperature sensing elements such as the temperature sensor and the temperature transmitter may be used for temperature acquisition.

The above gas density relay body 1 includes a density relay with indication (a density relay with pointer display, or a density relay with digital display, or a density relay with liquid crystal display), and a density relay without indication (i.e., a density switch).

In the above drive contact action mechanism 15, the force application mechanism and the movement mechanism may further be integrally designed; or, the drive component of the force application mechanism and the force transmission part driven by the drive component may further be integrally designed; and the push rod of the movement mechanism generally refers to a push part, and the push rod (push part) moves under driving of the force application mechanism, and directly or indirectly enables the signal action mechanism to generate a displacement. The force transmission part generally refers to a force transmission component, and includes, but is not limited to, one of a cam, a connecting rod, a spring, a metal part, a non-metal part, an expansion part and a non-expansion part. The driving contact action mechanism may be arranged in a housing of the gas density relay body. An end part, penetrating out of the fixed frame, of the push rod, stretches into the housing from a gas hole in the housing of the gas density relay body, the push rod may contact with an inner wall of the housing in a sealed manner, or may be not in contact with the inner wall of the housing; and the push rod is arranged opposite to a pressure detection element, or a temperature compensation element, or a signal generator, or a signal action mechanism, or the push rod is connected with or contacts with the pressure detection element, or the temperature compensation element, or the signal generator, or the signal action mechanism directly or indirectly. The force measurement sensor may further be connected with the pressure detection element, or the temperature compensation element, or the signal generator, or the signal action mechanism through a contact part or directly. A triggering part pushing the signal generator and connecting or disconnecting a contact of the signal generator is arranged on the signal action mechanism, specifically, the triggering part completes the connection or disconnection for the contact of the signal generator (specifically being a magnetic-assisted electrical contact) according to the gas density value, and the gas density relay body outputs a contact signal through the signal generator (specifically being a magnetic-assisted electrical contact).

The above gas density relay has functions of pressure and temperature measurement, and software conversion. On the premise that the safety running of the electrical equipment is not influenced, an alarm and/or locking contact action value and/or return value of the gas density relay may be detected online. Certainly, return values of the alarm contact signal and/or the blocking contact signal may also not be tested as required.

The above intelligent control unit 7 mainly completes control and signal acquisition for the driving contact action mechanism, can detect the pressure value and the temperature value, in the case of contact signal action of the gas density relay body, the pressure value and the temperature value are converted into a pressure value P20(density value) corresponding to 20° C., that is, a contact action value PD20 of the gas density relay can be detected, and check working for the gas density relay body is completed. Or, a density value PD20 in the case of contact signal action of the gas density relay body can be directly detected, and check working for the gas density relay body is completed, which is the most basic requirement. Of course, the intelligent control unit 7 may further achieve: a storage of test data; and/or an export of test data; and/or printing of test data; and/or data communication with an upper computer; and/or input of information of the analog and digital quantities. The intelligent control unit 7 further includes a communication module, and long-distance transmission for test data and/or a check result and other information is realized through the communication module. When a rated pressure value of the gas density relay body outputs a signal, the intelligent control unit 7 acquires a current density value at the same time, so that check on the rated pressure value of the gas density relay is completed. The gas density relay automatically carries out comparison and judgment, and if an error difference is large, an abnormality prompt is given: there is a problem with the pressure detector or the pressure sensor, the temperature sensor, etc. of the gas density relay. That is, the gas density relay can complete a mutual check function for the pressure detector, the pressure sensor, the temperature sensor, or the density transmitter, etc. of the gas density relay; and can complete mutual check on the pressure detector, the pressure sensor, the temperature sensor, etc. of the gas density relay. While completing the check on the gas density relay, the gas density relay automatically carries out mutual comparison and judgment, and if an error difference is large, an abnormality prompt is given: there is a problem with the pressure detector or the pressure sensor, the temperature sensor, etc. of the gas density relay. That is, the gas density relay can complete a mutual check function for the pressure detector, or the pressure sensor, the temperature sensor, or the density transmitter, etc. of the gas density relay. The gas density relay is capable of realizing manual intelligent check; after the check working for the gas density relay is completed, a check report for the density relay can be automatically generated, and if there is any abnormality, an alarm can be automatically sent, or an alarm may be sent to a designated receiver, such as a mobile phone; the gas density value and the check results may be displayed on the spot or through the background, and a specific manner may be flexible; the gas density relay has functions of real-time on-line display for the gas density value, the pressure value, the temperature value and other data, change trend analysis, historical data query, real-time alarm, etc.; the gas density value, or the density value, the pressure value and the temperature value may be monitored on line; the gas density relay has a self-diagnostic function, can timely notify abnormality, such as disconnection, short-circuit alarm, sensor damage, etc.; and comparison for error performance of the gas density relay can be carried out at different temperatures and in different time periods, that is, comparison in different periods and within the same temperature range is carried out, so that performance of the gas density relay is judged. A comparison among different historical periods, and a comparison between the history and the present are included. The gas density relay may further be examined; and whether the gas density relay and the density value of the monitored electrical equipment is normal or not is judged. That is, normality and abnormality judgment, analysis and comparison may be carried out on the density value of the electrical equipment, and the pressure detector, the pressure sensor, the temperature sensor, etc. of the gas density relay, and then the gas density monitoring for the electrical equipment, the judgment, comparison and analysis for the state of the gas density relay are realized; and an analysis system (expert management and analysis system) is further included, and used for monitoring the gas density, and detecting, analyzing and judging the gas density relay and the monitored elements, so as to know where the problem lies, whether in the electrical equipment or the gas density relay; and the contact signal state of the gas density relay body is further monitored, and the state is transmitted remotely. The contact signal state of the gas density relay body may be known to be open or closed at the background, so that another layer of monitoring is provided to improve reliability; the temperature compensation performance of the gas density relay body can further be detected, or detected and judged; contact resistance of the contact of the gas density relay body can further be detected, or detected and judged; and the gas density relay has functions of data analysis and data processing, and can carry out corresponding fault diagnosis and prediction on the electrical equipment.

As long as detection data among the pressure sensor 2, the temperature sensor 3, the pressure detection element 103, the temperature compensation element 104, etc. are consistent and normal, indicating that the gas density relay is normal, it is unnecessary for maintenance personnel to verify the gas density relay on the spot in a traditional manner, and no manual check throughout a whole life may be realized. Unless the detection data among the pressure sensor 2, the temperature sensor 3, the pressure detection element 103 and the temperature compensation element 104 of the gas density relay, etc. in a substation are inconsistent and abnormal, maintenance personnel are arranged for handling. Manual check is not required for the consistent and normal detection data, so that the reliability is greatly improved, efficiency is greatly increased, and cost is reduced.

Embodiment VIII

Figure 8:
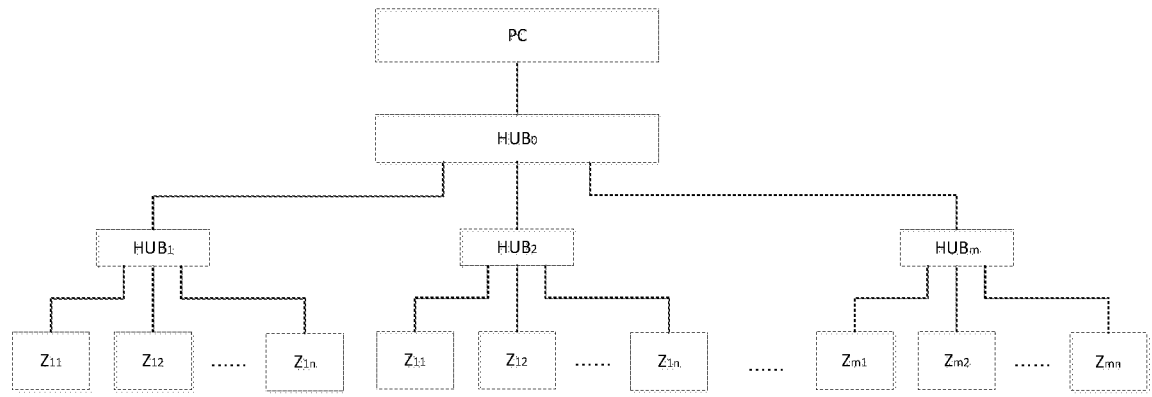
FIG. 8 and FIG. 9 show a self-diagnostic gas density monitoring system in an example 8.
Figure 9:
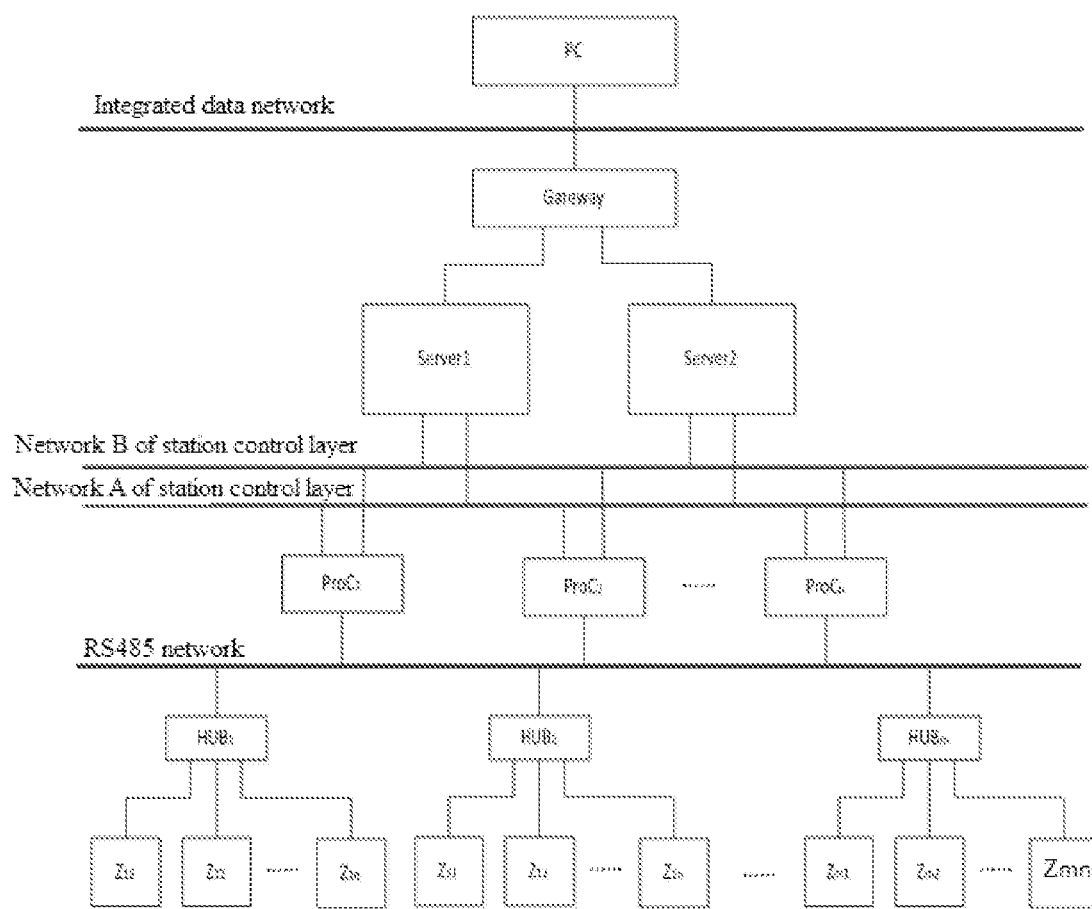

FIG. 8 to FIG. 9 show a self-diagnostic gas density monitoring system, and the gas density monitoring system includes the above self-diagnostic gas density relay (or gas density monitoring apparatus).

As shown in FIG. 8, a plurality of electrical equipment provided with gas chambers and a plurality of self-diagnostic gas density relays (or gas density monitoring apparatuses) are sequentially connected with a remote background detection system through hubs and IEC61850 protocol converters; where the self-diagnostic gas density relays (or gas density monitoring apparatuses) are respectively arranged on the electrical equipment with the corresponding gas chambers.

Referring to FIG. 8 and FIG. 9, PC is an on-line monitoring background host and system, Gateway is a network switch, Server is an integrated application server, ProC is a protocol converter/on-line monitoring intelligent unit, HUB is a hub, and Z is a self-diagnostic gas density relay (or gas density monitoring apparatus). An on-line monitoring system architecture includes: a simple architecture (FIG. 8) and a conventional architecture (FIG. 9) which are listed in detail.

TA system architecture diagram and simple description: 1) background software platform: based on Windows, Linux and others, or VxWorks, Android, Unix, UCos, FreeRTOS, RTX, embOS, MacOS; 2) key service modules and basic functions of background software: for example, rights management, equipment management, data storage and query, etc. and user management, alarm management, real-time data, historical data, real-time curves, historical curves, configuration management, data acquisition, data analysis, recording conditions, abnormity handling, etc; and 3) interface configuration: for example, a Form interface, a Web interface, a configuration interface, etc.

Specifically, as shown in FIG. 8, the on-line monitoring background host and system PC communicates with a plurality of HUBs (HUB1, HUB2, . . . HUBm) through a HUB0. Each HUB is connected with a group of the self-diagnostic gas density relays (or gas density monitoring apparatuses) Z, for example, the HUB1 is connected with the self-diagnostic gas density relays (or gas density monitoring apparatuses) Z11, Z12, . . . Z1n, and the HUB2 is connected with the self-diagnostic gas density relays (or gas density monitoring apparatuses) Z21, Z22, . . . Z2n, and the HUBm is connected with the self-diagnostic gas density relays (or gas density monitoring apparatuses) Zm1, Zm2, . . . Zmn, where m and n are both natural numbers.

As shown in FIG. 9, the on-line monitoring background host and system PC is connected with two integrated application servers (Server1 and Server2) through a network switch Gateway, and the two integrated application servers (Server1 and Server2) communicate with a plurality of protocol converters/on-line monitoring intelligent units ProC (ProC1, ProC2, . . . ProCn) through a network A and a network B of a station control layer, and the protocol converter/on-line monitoring intelligent unit ProC communicates with a plurality of HUBs (HUB1, HUB2, . . . HUBm) through a R5485 network. Each HUB is connected to a group of field detection devices Z, for example, HUB1 is connected to the field detection devices Z11, Z12, . . . , Z1n, HUB2 is connected to the field detection devices Z21, Z22, Z2n, . . . , and HUBm is connected to the field detection devices Zm1, Zm2, Zmn, where m and n are natural numbers.

In addition, there may be a wireless transmission architecture, for example, a plurality of the integrated application servers (Server1, Server2, . . . Server n) communicate with each gas density relay wirelessly through a Cloud, a wireless gateway, and a wireless module of each gas density relay. N is a natural number.

The self-diagnostic gas density relay (or gas density monitoring apparatus) may realize the following functions: 1) carrying out on-line monitoring for a gas density, or being capable of realizing on-line monitoring for the gas density and a moisture content, or realizing on-line monitoring for the gas density, the moisture content and contents of decomposed products; 2) carrying out on-line check on the density relay (being capable of carrying out on-line check on contact signal values and display values of the density relay); 3) being capable of realizing reliable performance of a system through mutual check of electronic detection (monitoring) and mechanical detection (monitoring), and then realizing no manual check throughout a whole life cycle; Unless detection data among the pressure sensor 2, the temperature sensor 3, and the gas density relay body 1 of electrical equipment in a substation are inconsistent and abnormal, maintenance personnel are arranged for handling. Check is not required for the consistent and normal detection data, so that the reliability is greatly improved, efficiency is increased, and cost is reduced; and 4) even zero check on the pressure sensor 2 may be carried out.

The self-diagnostic gas density relay (or gas density monitoring apparatus) has a self-diagnostic function, and is capable of carrying out self-diagnosis on each element and diagnosing a process, such as a monitoring process or a check process; and the gas density relay has performance of self-check and comparison.

The self-diagnostic gas density relay (or gas density monitoring apparatus) includes a plurality of pressure sensors and temperature sensors, and normal operation of the gas density relay is guaranteed through mutual check on test data of the plurality of pressure sensors and temperature sensors, and mutual check on test data of the sensors and the gas density relay body.

The self-diagnostic gas density relay (or gas density monitoring apparatus) compares an environment temperature value transmitted, with a sampling value of the temperature sensor to complete check for the temperature sensor.

The self-diagnostic gas density relay (or gas density monitoring apparatus) monitors the corresponding position or/and corresponding displacement or/and deformation quantity of at least one of the main elements of the gas density relay body through the diagnostic sensor according to the gas density during monitoring, and diagnoses the current working state of the gas density relay body; or, the self-diagnostic gas density relay (or gas density monitoring apparatus) monitors the corresponding position or/and corresponding displacement or/and deformation quantity of at least one of the main elements of the gas density relay body through the diagnostic sensor according to the gas pressure during monitoring, and diagnoses the current working state of the gas density relay body; or, the self-diagnostic gas density relay (or gas density monitoring apparatus) monitors the corresponding position or/and corresponding displacement or/and deformation quantity of at least one of the main elements of the gas density relay body through the diagnostic sensor according to the temperature during monitoring, and diagnoses the current working state of the gas density relay body. The main elements of the gas density relay body may include: a pressure detection element, a temperature compensation element, a signal generator, a signal adjustment mechanism, a core, and a pointer. The diagnostic sensor may be arranged on the core, or on the pointer, or on the connection rod; or, two diagnostic sensors are arranged, one of which is arranged on the pressure detection element, and the other is arranged on the temperature compensation element. The intelligent control unit or the background judges according to the pressure value acquired under the same gas pressure, and the corresponding position or/and corresponding displacement or/and deformation quantity detected by the diagnostic sensor on the pressure detection element; and/or, the intelligent control unit judges according to the temperature value acquired under the same gas environment temperature, and the corresponding position or/and corresponding displacement or/and deformation quantity detected by the diagnostic sensor on the temperature compensation element; or, the intelligent control unit judges according to the density value acquired under the same gas density, and the corresponding position or/and corresponding displacement or/and deformation quantity detected by the diagnostic sensor on the signal adjustment mechanism or/and the core or/and the pointer; and the current working state of the monitored state of the gas density relay is obtained. The core is connected with the temperature compensation element directly, and transfers the density value.

It should be noted that, the self-diagnostic gas density relay in the present application generally refers to that the components of the self-diagnostic gas density relay are designed into an integrated structure; and the gas density monitoring apparatus generally refers to that the components of the gas density monitoring apparatus are designed into split structures with flexible composition. The gas temperature generally refers to a temperature in the gas or a corresponding environment temperature. The diagnosis method in the present invention may include that the corresponding differences are respectively within the preset thresholds, the detection values are within preset ranges, and the two corresponding detection values are divided into their preset thresholds. The intelligent control unit or/and the background can also complete the comparison of the corresponding detection results in a flexible way. Technical transformation and upgrading may be carried out for the gas density relay by virtue of an original gas density relay in a substation.

The embodiments of the present invention have been described in detail above, but are merely embodiments, and the present invention is not limited thereto. Any equivalent modifications and substitutions made to the present invention are also within the scope of the present invention for those skilled in the art. Therefore, equivalent changes and modifications made without departing from the spirit and scope of the present invention should be included within the scope of the present invention.

What is claimed is:

1. A self-diagnostic gas density relay, comprising a gas density relay body, a gas density detection sensor, at least one diagnostic sensor, and an intelligent control unit;
   the gas density relay body comprises: a housing, and a pressure detection element, a temperature compensation element, a signal generator, and a signal action mechanism which are arranged in the housing;
   the gas density detection sensor is communicated with the gas density relay body, and used for acquiring a pressure value, a temperature value, and/or a gas density value;
   the diagnostic sensor is arranged in the housing of the gas density relay body, and configured to acquire deformation quantities of components that generate deformations, and/or positions or displacement quantities of components that generate displacements when the pressure changes, or the temperature changes, or the gas density changes in the gas density relay body; and
   the intelligent control unit is respectively connected with the gas density detection sensor and the diagnostic sensor, receives data acquired by the gas density detection sensor and/or the diagnostic sensor, and diagnoses whether a current working state of the gas density relay body is normal or not by judging whether the deformation quantities, and/or the positions, and/or the displacement quantities are within preset thresholds or not, or by comparing the deformation quantities, and/or the positions, and/or the displacement quantities with preset standard values corresponding thereto; or, the intelligent control unit uploads the received data to a background, and the background diagnoses whether the current working state of the gas density relay body is normal or not by judging whether the deformation quantities, and/or the positions, and/or the displacement quantities are within the preset thresholds or not, or by comparing the deformation quantities, and/or the positions, and/or the displacement quantities with preset standard values corresponding thereto.

2. The self-diagnostic gas density relay according to claim 1, wherein the diagnostic sensor is arranged on the pressure detection element; or, the diagnostic sensor is arranged on the temperature compensation element; or, the diagnostic sensor is arranged on the signal action mechanism; or, there are two diagnostic sensors, one of which is arranged on the pressure detection element, and the other is arranged on the temperature compensation element.

3. The self-diagnostic gas density relay according to claim 1, wherein the gas density detection sensor comprises at least one pressure sensor and at least one temperature sensor, wherein the pressure sensor is installed in a gas path of the gas density relay body; and the temperature sensor is installed in or out of the gas path of the gas density relay body, or is installed in or out of the gas density relay body; or the gas density detection sensor is a gas density transmitter composed of a pressure sensor and a temperature sensor; or the gas density detection sensor is a density detection sensor adopting a quartz tuning fork technology.

4. The self-diagnostic gas density relay according to claim 1, wherein the intelligent control unit obtains a gas density value acquired by the gas density detection sensor; or, the intelligent control unit obtains a pressure value and a temperature value which are acquired by the gas density detection sensor, so that on-line monitoring for the gas density of the monitored electrical equipment by the gas density relay is completed.

5. The self-diagnostic gas density relay according to claim 1, wherein the gas density relay further comprises a drive contact action mechanism, and the drive contact action mechanism is arranged in or out of the housing of the gas density relay body, and connected with the intelligent control unit; the drive contact action mechanism comprises a force application mechanism and a movement mechanism, the force application mechanism comprises a drive component and a force transmission part driven by the drive component, the movement mechanism comprises a push rod, and the push rod moves under the driving of the force application mechanism, to apply an action force on the gas density relay body, and directly or indirectly enables the signal action mechanism to generate a displacement, so as to trigger the signal generator to generate a contact signal action, and the contact signal includes alarm and/or blocking; wherein
   the drive component comprises one or more of a magnetic drive mechanism, gravity, a motor, a reciprocating movement mechanism, a Carnot cycle mechanism, an air compressor, a compressor, a gas release valve, a pressure making pump, a booster pump, a booster valve, an electric air pump, an electromagnetic air pump, a pneumatic element, a magnetic coupling thrust mechanism, a heating thrust-generation mechanism, a mechanism generating thrust with electrical heating, and a mechanism generating thrust with chemical reaction; and
   the force transmission part comprises one of a cam, a connecting rod, a spring, a metal part, a non-metal part, an expansion part and a non-expansion part.

6. The self-diagnostic gas density relay according to claim 5, wherein the gas density relay body further comprises a base, an end base and a core which are arranged in the housing; the core is fixed on the base; the pressure detection element is a Bourdon tube, one end of the pressure detection element is fixed on the base and communicated with the base, the other end of the pressure detection element is connected with one end of the temperature compensation element through the end base, and the other end of the temperature compensation element is provided with the signal action mechanism; an adjusting screw or a triggering part for pushing the signal generator and connecting or disconnecting a contact of the signal generator is arranged on the signal action mechanism, and the gas density relay body outputs contact signals through the signal generator;

and the drive contact action mechanism is arranged outside the housing of the gas density relay body, and the drive contact action mechanism further comprises an outer cover with an opening, the outer cover is fixedly connected to the housing, the opening faces the housing, and the drive component, the force transmission part, and the push rod are arranged in the outer cover.

7. The self-diagnostic gas density relay according to claim 5, wherein the gas density relay body further comprises a first bellow arranged in the housing as the pressure detection element, and a second bellow, a first open end of the first bellow is fixed on an inner wall of the housing, a second open end of the first bellow is connected with a first sealing part in a sealed manner, an inner wall of the first bellow, the first sealing part, and the inner wall of the housing form a first sealing gas chamber in an encircling manner, and the first sealing gas chamber is provided with a connector communicated with insulating gas of the electrical equipment; a first open end of the second bellow is connected with the first sealing part in a sealed manner, a second open end of the second bellow is connected with the inner wall of the housing through a second sealing part, an outer wall of the first bellow, the first sealing part, an outer wall of the second bellow, the second sealing part, and the inner wall of the housing form a second sealing gas chamber in an encircling manner, and the second sealing gas chamber is filled with standard compensation gas to form the temperature compensation element; an inner wall of the second bellow, the second sealing part, and the inner wall of the housing form a third gas chamber in an encircling manner, the signal generator and the signal action mechanism are arranged in the third gas chamber, the signal action mechanism is connected with the first sealing part, and the signal generator is arranged corresponding to the signal action mechanism; and the driving contact action mechanism is arranged in the housing of the gas density relay body, one end, close to the force transmission part, of the push rod, is provided with a fixing part, and one end, away from the force transmission part, of the push rod, penetrates through the fixed frame fixed on the inner wall of the housing, and extends to a place below the fixed frame to be arranged opposite to the signal action mechanism.

8. The self-diagnostic gas density relay according to claim 5, wherein the gas density relay further comprises a force measurement sensor, the force measurement sensor is arranged on the driving contact action mechanism or arranged in the housing, connected with the intelligent control unit, and configured to detect a force applied by the driving contact action mechanism on the gas density relay body; wherein the force measurement sensor includes one of a gravity sensor, a pressure sensor, a magnetic sensor, a displacement sensor, a deformation quantity sensor, a photoelectric sensor, an angle sensor, and a camera.

9. The self-diagnostic gas density relay according to claim 8, wherein the force measurement sensor is arranged on the push rod of the driving contact action mechanism; or, the force measurement sensor is arranged on the pressure detection element; or, the force measurement sensor is arranged on the temperature compensation element; or, the force measurement sensor is arranged on the signal action mechanism.

10. The self-diagnostic gas density relay according to claim 1, wherein the gas density relay further comprises an on-line check contact signal sampling unit, and the online check contact signal sampling unit is respectively connected with the signal generator and the intelligent control unit of the gas density relay body, and configured to sample the contact signals of the gas density relay body; the on-line check contact signal sampling unit comprises an isolation sampling element, and the isolation sampling element is controlled by the gas density relay body or the intelligent control unit; in a non-check state, the on-line check contact signal sampling unit is relatively isolated from the contact signal of the gas density relay body in a circuit through the isolation sampling element; in a check state, the on-line check contact signal sampling unit cuts off a control loop for the contact signal of the gas density relay body through the isolation sampling element, and connects the contact of the gas density relay body with the intelligent control unit; wherein the isolation sampling element comprises one of a travel switch, a microswitch, a button, an electric switch, a displacement switch, an electromagnetic relay, an optical coupler, and a silicon controlled rectifier.

11. The self-diagnostic gas density relay according to claim 10, wherein the gas density relay further comprises a multi-way connector, and one or more of the gas density relay body, the gas density detection sensor, the on-line check contact signal sampling unit, and the intelligent control unit are arranged on the multi-way connector.

12. A use method of the self-diagnostic gas density relay according to claim 1, comprising: in a normal working state, the gas density relay monitors a gas density value in electrical equipment through the gas density detection sensor;
the diagnostic sensor acquires deformation quantities of components that generate deformations, and/or positions or displacement quantities of components that generate displacements when a pressure changes, or a temperature changes, or a gas density changes in a gas density relay body, and sends the acquired data to an intelligent control unit;
the intelligent control unit receives the data acquired by the gas density detection sensor and/or the diagnostic sensor, and diagnose whether a current working state of the gas density relay body is normal or not by judging whether the deformation quantities, and/or the positions, and/or the displacement quantities are within preset thresholds or not, or by comparing the deformation quantities, and/or the positions, and/or the displacement quantities with preset standard values corresponding thereto; or, the intelligent control unit uploads the received data to a background, and the background diagnoses whether the current working state of the gas density relay body is normal or not by judging whether the deformation quantities, and/or the positions, and/or the displacement quantities are within the preset thresholds or not, or by comparing the deformation quantities, and/or the positions, and/or the displacement quantities with preset standard values corresponding thereto.

13. The use method of the self-diagnostic gas density relay according to claim 12, comprising: the diagnostic sensor detects a deformation quantity of the temperature compensation element of the gas density relay body relative to an overall dimension at 20° C., the intelligent control unit or the background judges whether the deformation quantity is within a preset threshold or not, if the deformation quantity is within the preset threshold, a current working state of the temperature compensation element is normal, otherwise, the current working state is abnormal; or,
a corresponding relationship between a temperature change value $\Delta T$ of each historical detected environment temperature T relative to 20° C., and a corresponding preset standard value of a deformation quantity $\Delta L$ of the temperature compensation element is pre-generated into a data table; the intelligent control unit or the background calculates a difference, that is, an error, between the deformation quantity detected by the diagnostic sensor, of the temperature compensation element, and the corresponding preset standard value obtained by querying the data table, under current temperature change, and judges whether the error is within a preset threshold or not, if the error is within the preset threshold, the current working state of the temperature compensation element is normal, otherwise, the current working state is abnormal; where $\Delta T=|T-20|°$ C., $\Delta L=|L_T-L_{20}|$, $L_T$ is a corresponding overall dimension of the temperature compensation element at an environment temperature T, and $L_{20}$ is a corresponding overall dimension of the temperature compensation element at 20° C.

14. The use method of the self-diagnostic gas density relay according to claim 12, comprising: the diagnostic sensor detects a position of the temperature compensation element of the gas density relay body under a set gas density value, and the intelligent control unit or the background judges whether the position is within a preset threshold or not, if the position is within the preset threshold, the current working state of the temperature compensation element is normal, otherwise, the current working state is abnormal; or, a corresponding relationship between each historical detected gas density value and a corresponding preset standard value of the position of the temperature compensation element is pre-generated into a data table; the intelligent control unit or the background calculates a difference, that is, an error, between the position detected by the diagnostic sensor, of the temperature compensation element, and the corresponding preset standard value obtained by querying the data table, under a current gas density, judges whether the error is within a preset threshold or not, if the error is within the preset threshold, the current working state of the temperature compensation element is normal, otherwise the current working state is abnormal; or, the diagnostic sensor detects a displacement quantity of the temperature compensation element when the gas density changes, and the intelligent control unit or the background judges whether the displacement quantity is within a preset threshold or not, if the displacement quantity is within the preset threshold, the current working state of the temperature compensation element is normal, otherwise, the current working state is abnormal; or, a corresponding relationship between each historical detected gas density change value and a corresponding preset standard value of the displacement quantity of the temperature compensation element is pre-generated into a data table; the intelligent control unit or the background calculates a difference, that is, an error, between the displacement quantity detected by the diagnostic sensor, of the temperature compensation element, and the corresponding preset standard value obtained by querying the data table, under current gas density change, judges whether the error is within a preset threshold or not, if the error is within the preset threshold, the current working state of the temperature compensation element is normal, otherwise the current working state is abnormal.

15. The use method of the self-diagnostic gas density relay according to claim 12, comprising: the diagnostic sensor detects a position of the pressure detection element under a set gas pressure value, and the intelligent control unit or the background judges whether the position is within a preset threshold or not, if the position is within the preset threshold, a current working state of the pressure detection element is normal, otherwise, the current working state is abnormal; or, a corresponding relationship between each historical detected gas pressure value and a corresponding preset standard value of the position of the pressure detection element is pre-generated into a data table; the intelligent control unit or the background calculates a difference, that is, an error, between the position detected by the diagnostic sensor, of the pressure detection element, and the corresponding preset standard value obtained by querying the data table, under a current gas pressure, judges whether the error is within a preset threshold or not, if the error is within the preset threshold, the current working state of the pressure detection element is normal, otherwise the current working state is abnormal; or, the diagnostic sensor detects a displacement quantity of the pressure detection element when the gas pressure changes, and the intelligent control unit or the background judges whether the displacement quantity is within a preset threshold or not, if the displacement quantity is within the preset threshold, the current working state of the pressure detection element is normal, otherwise, the current working state is abnormal; or, a corresponding relationship between each historical detected gas pressure change value and a corresponding preset standard value of the displacement quantity of the pressure detection element is pre-generated into a data table; the intelligent control unit or the background calculates a difference, that is, an error, between the displacement quantity detected by the diagnostic sensor, of the pressure detection element, and the corresponding preset standard value obtained by querying the data table, under current gas pressure change, and judges whether the error is within a preset threshold or not, if the error is within the preset threshold, the current working state of the pressure detection element is normal, otherwise, the current working state is abnormal.

16. The use method of the self-diagnostic gas density relay according to claim 12, comprising: the diagnostic sensor detects a position of the signal action mechanism under a set gas density value, and the intelligent control unit or the background judges whether the position is within a preset threshold or not, if the position is within the preset threshold, the current working state of the signal action mechanism is normal, otherwise, the current working state is abnormal; or, a corresponding relationship between each historical detected gas density value and a corresponding preset standard value of the position of the signal action mechanism is pre-generated into a data table; the intelligent control unit or the background calculates a difference, that is, an error, between the position detected by the diagnostic sensor, of the signal action mechanism, and the corresponding preset standard value obtained by querying the data table, under a current gas density, judges whether the error is within a preset threshold or not, if the error is within the preset threshold, the current working state of the signal action mechanism is normal, otherwise the current working state is abnormal; or, the diagnostic sensor detects a displacement quantity of the signal action mechanism when the gas density value changes, and the intelligent control unit or the background judges whether the displacement quantity is within a preset threshold or not, if the displacement quantity is within the preset threshold, the current working state of the signal action mechanism is normal, otherwise, the current working state is abnormal; or, a corresponding relationship between each historical detected gas density change value and a corresponding preset standard value of the displacement quantity of the signal action mechanism is pre-generated into a data table; the intelligent control unit or the background calculates a difference, that is, an error, between the displacement quantity detected by the diagnostic sensor, of the signal action mechanism, and the corresponding preset standard value obtained by querying the data table, under current gas density change, and judges whether the error is within a preset threshold or not, if the error is within the preset threshold, the current working state of the signal action mechanism is normal, otherwise, the current working state is abnormal.

17. The use method of the self-diagnostic gas density relay according to claim 12, wherein the gas density relay further comprises a driving contact action mechanism, and the driving contact action mechanism is arranged in or out of the housing of the gas density relay body, and connected with the intelligent control unit, and the driving contact action mechanism is configured to apply an action force on the gas density relay body, directly or indirectly enable the signal action mechanism to generate a displacement, and/or drive the gas density relay body to generate a contact signal action; and the use method further comprises:

the intelligent control unit obtains a pressure value P1 and a temperature value T which are acquired by the gas density detection sensor, and a displacement quantity D acquired by the diagnostic sensor, in the case of contact signal action or switching of the gas density relay body, a corresponding pressure value is obtained by calculating or converting according to the displacement quantity D, an equivalent gas pressure value P is obtained by calculating according to the pressure value P1 and the pressure value P2; and a pressure value corresponding to 20° C., i.e., a gas density value $P_{20}$, is obtained by converting according to the equivalent gas pressure value P and a gas pressure-temperature characteristic, so that on-line check on the gas density relay is completed; or, The intelligent control unit obtains a gas density value $P1_{20}$ acquired by the gas density detection sensor, and a displacement quantity D acquired by the diagnostic sensor, in the case of contact signal action or switching of the gas density relay body, a corresponding gas density value $P2_{20}$ is obtained by calculating or converting in combination with a temperature value T acquired by the temperature sensor, and the gas density value P20 is obtained by calculating according to the gas density value $P1_{20}$ and the gas density value $P2_{20}$, so that on-line check on the gas density relay is completed.

18. The use method of the self-diagnostic gas density relay according to claim 17, wherein in the case of contact signal action or switching of the gas density relay body, the equivalent gas pressure value P=P1−P2; a pressure value corresponding to 20° C., i.e., a gas density value $P_{20}$, is obtained by converting according to the equivalent gas pressure value P and the gas pressure-temperature characteristic, so that on-line check on the gas density relay is completed; or, Further, in the case of contact signal action or switching of the gas density relay body, the equivalent gas pressure value P=P1−P2*K, where K is a preset coefficient; and a pressure value corresponding to 20° C., i.e., a gas density value P20, is obtained by converting according to the equivalent gas pressure value P and the gas pressure-temperature characteristic, so that on-line check on the gas density relay is completed; or, in the case of contact signal action or switching of the gas density relay body, a corresponding relationship among the gas density value $P_{20}$, the gas density value $P1_{20}$, and the gas density value $P2_{20}$ is pre-set into a data table, and the corresponding gas density value $P_{20}$ is obtained by querying the data table according to the gas density value $P1_{20}$ and the gas density value $P2_{20}$, so that on-line check on the gas density relay is completed; or, in the case of contact signal action or switching of the gas density relay body, a corresponding relationship among the gas density value $P_{20}$, the gas pressure value P1, the gas pressure value P2, and the temperature value T is pre-set into a data table, and the corresponding gas density value $P_{20}$ is obtained by querying the data table according to the gas pressure value P1, the gas pressure value P2, and the temperature value T, so that on-line check on the gas density relay is completed.

19. The use method of the self-diagnostic gas density relay according to claim 17, wherein the gas density relay further comprises a force measurement sensor, the force measurement sensor is arranged on the driving contact action mechanism or arranged in the housing, connected with the intelligent control unit, and configured to detect a force applied by the driving contact action mechanism on the gas density relay body; and the use method further comprises:

the intelligent control unit obtains a pressure value P1 and a temperature value T which are acquired by the gas density detection sensor, and a signal value F acquired by the force measurement sensor, in the case of contact signal action or switching of the gas density relay body, a corresponding equivalent pressure value P3 is obtained by calculating or converting according to the pressure value P1, the temperature value T, and the signal value F, and an equivalent gas pressure value P is obtained by calculating according to the pressure value P1 and the pressure value P3; a pressure value corresponding to 20° C., i.e., a gas density value $P_{20}$, is obtained by converting according to the equivalent gas pressure value P and the gas pressure-temperature characteristic, so that on-line check on the gas density relay is completed; or, The intelligent control unit obtains a gas density value $P1_{20}$ acquired by the gas density detection sensor, a signal value F acquired by the force measurement sensor, and a temperature value acquired by the temperature sensor, in the case of contact signal action or switching of the gas density relay body, a corresponding equivalent gas density value $P3_{20}$ is obtained by calculating and converting according to the gas density value $P1_{20}$, the signal value F, and the temperature value, and the gas density value $P_{20}$ is obtained by calculating according to the gas density value $P1_{20}$ and the gas density value $P3_{20}$, so that on-line check on the gas density relay is completed.

20. The use method of the self-diagnostic gas density relay according to claim 19, comprising:
- in the case of contact signal action or switching of the gas density relay body, the equivalent gas pressure value P=P1−P3; a pressure value corresponding to 20° C., i.e., a gas density value $P_{20}$, is obtained by converting according to the equivalent gas pressure value P and the gas pressure-temperature characteristic, so that on-line check on the gas density relay is completed; or,
- in the case of contact signal action or switching of the gas density relay body, the equivalent gas pressure value P=P1−P3*M, where M is a preset coefficient; and a pressure value corresponding to 20° C., i.e., a gas density value $P_{20}$, is obtained by converting according to the equivalent gas pressure value P, the temperature value T, and the gas pressure-temperature characteristic, so that on-line check on the gas density relay is completed; or,
- in the case of contact signal action or switching of the gas density relay body, a corresponding relationship among the gas density value $P_{20}$, the gas density value $P1_{20}$, and the gas density value $P3_{20}$ is pre-designed into a data table, and the corresponding gas density value $P_{20}$ is obtained by querying the data table according to the gas density value $P1_{20}$ and the gas density value $P3_{20}$, so that on-line check on the gas density relay is completed; or,
- in the case of contact signal action or switching of the gas density relay body, a corresponding relationship among the gas density value P20, the gas pressure value P1, the gas pressure value P3 and the temperature value T is pre-designed into a data table, and the corresponding gas density value P20 is obtained by querying the data table according to the gas pressure value P1, the gas pressure value P3, and the temperature value T, so that on-line check on the gas density relay is completed; or,
- in the case of contact signal action or switching of the gas density relay body, a corresponding relationship among the gas density value $P_{20}$, the gas pressure value P1, the signal value F acquired by the force measurement sensor, and the temperature value T is pre-designed into a data table, and the corresponding gas density value $P_{20}$ is obtained by querying the data table according to the gas pressure value P1, the signal value F acquired by the force measurement sensor, and the temperature value T, so that on-line check on the gas density relay is completed; or,
- in the case of contact signal action or switching of the gas density relay body, a corresponding relationship among the gas density value $P_{20}$, the gas pressure value P1, the displacement quantity D acquired by the diagnostic sensor, and the temperature value T is pre-designed into a data table, and the corresponding gas density value $P_{20}$ is obtained by querying the data table according to the gas pressure value P1, the displacement D acquired by the diagnostic sensor, and the temperature value T, so that on-line check on the gas density relay is completed.

* * * * *